United States Patent
Lee et al.

(10) Patent No.: US 11,848,365 B2
(45) Date of Patent: Dec. 19, 2023

(54) SEMICONDUCTOR DEVICE STRUCTURE WITH SOURCE/DRAIN STRUCTURE

(71) Applicant: Taiwan Semiconductor Manufacturing Company, Ltd., Hsinchu (TW)

(72) Inventors: Tung-Ying Lee, Hsinchu (TW); Kai-Tai Chang, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/833,373

(22) Filed: Jun. 6, 2022

(65) Prior Publication Data

US 2022/0302270 A1    Sep. 22, 2022

Related U.S. Application Data

(63) Continuation of application No. 17/028,683, filed on Sep. 22, 2020, now Pat. No. 11,355,605.

(Continued)

(51) Int. Cl.

| H01L 29/417 | (2006.01) |
|---|---|
| H01L 29/423 | (2006.01) |
| H01L 29/78 | (2006.01) |
| H01L 29/06 | (2006.01) |
| H01L 29/40 | (2006.01) |
| H01L 29/66 | (2006.01) |

(52) U.S. Cl.
CPC .... *H01L 29/41791* (2013.01); *H01L 29/0653* (2013.01); *H01L 29/0673* (2013.01); *H01L 29/401* (2013.01); *H01L 29/41775* (2013.01); *H01L 29/4236* (2013.01); *H01L 29/66795* (2013.01); *H01L 29/785* (2013.01)

(58) Field of Classification Search
CPC ......... H01L 29/78696; H01L 29/42392; H01L 29/0653; H01L 29/66795; H01L 29/0665; H01L 29/0673; H01L 2029/7858; H01L 21/823431; H01L 29/41791; H01L 29/1079; H01L 29/4236; H01L 29/41775; H01L 29/401
See application file for complete search history.

(56) References Cited

U.S. PATENT DOCUMENTS

| 9,209,247 B2 | 12/2015 | Colinge et al. |
| 9,236,267 B2 | 1/2016 | De et al. |

(Continued)

*Primary Examiner* — Changhyun Yi
(74) *Attorney, Agent, or Firm* — Birch, Stewart, Kolasch & Birch, LLP

(57) ABSTRACT

A semiconductor device structure is provided. The semiconductor device structure includes a substrate having a base and a fin over the base. The semiconductor device structure includes a gate structure wrapping around a top portion of the fin. The semiconductor device structure includes a first nanostructure over the fin and passing through the gate structure. The semiconductor device structure includes a source/drain structure over the fin. The source/drain structure is over a side of the gate structure and connected to the first nanostructure, the source/drain structure has an upper portion, a lower portion, and a neck portion between the upper portion and the lower portion, the upper portion has a first diamond-like shape, and the lower portion is wider than the neck portion.

20 Claims, 31 Drawing Sheets

Related U.S. Application Data

(60) Provisional application No. 62/928,028, filed on Oct. 30, 2019.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,355,605 B2 * | 6/2022 | Lee ........................ H01L 29/785 |
| 2018/0151683 A1 * | 5/2018 | Yeo ........................ H01L 27/092 |
| 2018/0323312 A1 * | 11/2018 | Van Dal ............. H01L 29/41725 |
| 2020/0098756 A1 * | 3/2020 | Lilak .................. H01L 29/78696 |
| 2020/0105753 A1 | 4/2020 | Kotlyar et al. |

* cited by examiner

I  I'

I          I'

SEMICONDUCTOR DEVICE STRUCTURE WITH SOURCE/DRAIN STRUCTURE

PRIORITY CLAIM AND CROSS-REFERENCE

This application is a Continuation of U.S. application Ser. No. 17/028,683, filed on Sep. 22, 2020, which claims the benefit of U.S. Provisional Application No. 62/928,028, filed on Oct. 30, 2019, and entitled "SEMICONDUCTOR DEVICE STRUCTURE WITH SOURCE/DRAIN STRUCTURE AND METHOD FOR FORMING THE SAME", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 9B-1 is a cross-sectional view illustrating a semiconductor device structure, in accordance with some embodiments.

FIG. 9B-2 is a cross-sectional view illustrating a semiconductor device structure, in accordance with some embodiments.

DETAILED DESCRIPTION

Figure 1A:
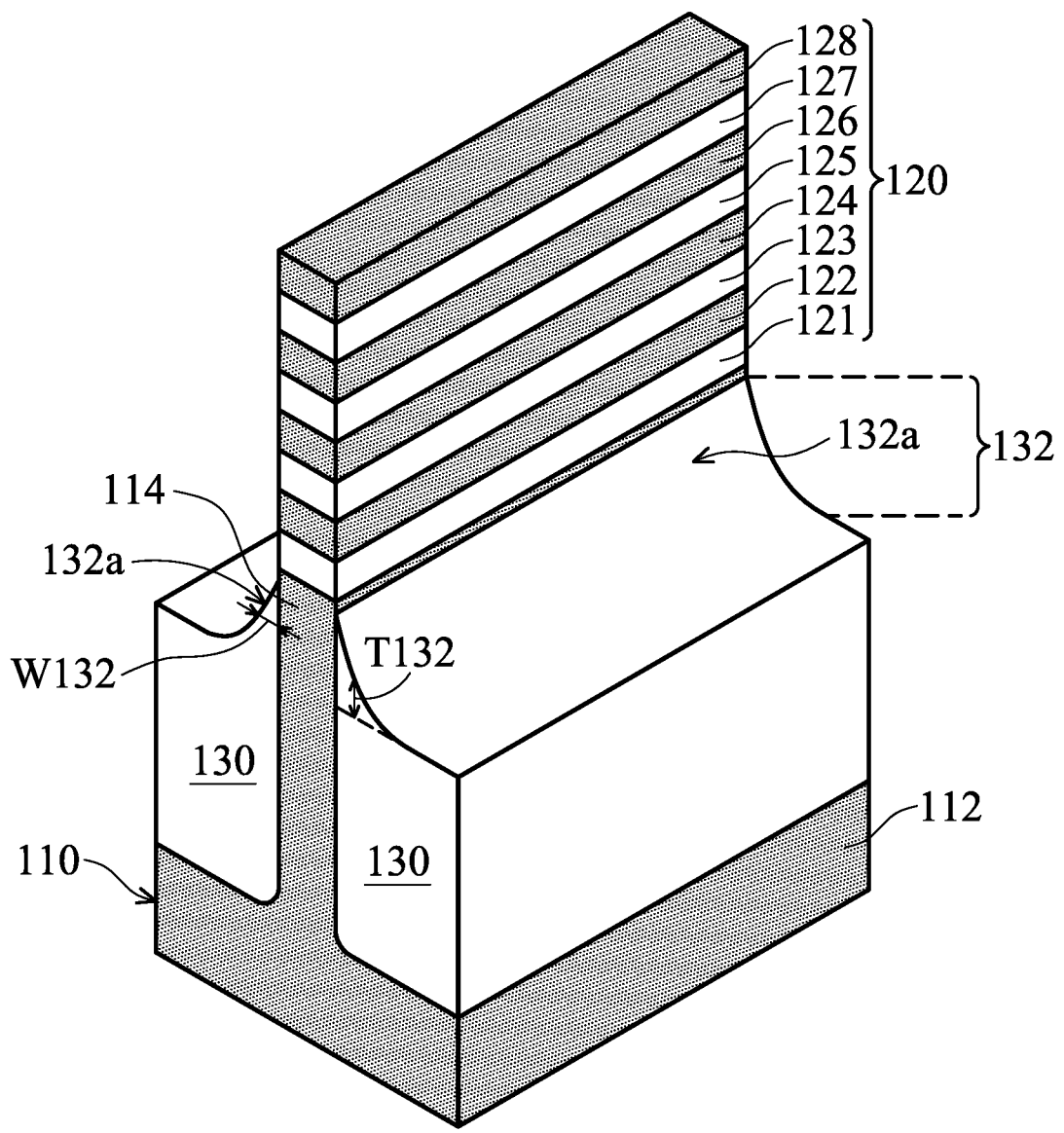
FIGS. 1A-1H are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The term "substantially" or "about" in the description, such as in "substantially flat" or in "substantially level with", etc., will be understood by the person skilled in the art. In some embodiments the adjective substantially may be removed. Where applicable, the term "substantially" may also include embodiments with "entirely", "completely", "all", etc. The term "about" in conjunction with a specific distance or size is to be interpreted so as not to exclude insignificant deviation from the specified distance or size. The term "substantially" or "about" may be varied in different technologies and be in the deviation range understood by the skilled in the art. For example, the term "substantially" or "about" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A-1H are perspective views of various stages of a process for forming a semiconductor device structure, in accordance with some embodiments. As shown in FIG. 1A, a substrate 110 is provided, in accordance with some embodiments. The substrate 110 has a base 112 and a fin 114 over the base 112, in accordance with some embodiments. The substrate 110 includes, for example, a semiconductor substrate 110. The semiconductor substrate 110 includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, nanostructures 121, 122, 123, 124, 125, 126, 127, and 128 are sequentially stacked over the fin 114, in accordance with some embodiments. The nanostructures 121, 122, 123, 124, 125, 126, 127, and 128 include nanowires or nanosheets, in accordance with some embodiments. The nanostructures 121, 122, 123, 124, 125, 126, 127, and 128 together form a nanostructure stack 120, in accordance with some embodiments.

The nanostructures 121, 123, 125, and 127 are made of a same first material, in accordance with some embodiments. The first material is different from the material of the substrate 110, in accordance with some embodiments. The first material is made of an elementary semiconductor material including silicon or germanium in a single crystal, polycrystal, or amorphous structure, in accordance with some embodiments.

The first material is made of a compound semiconductor, such as silicon carbide, gallium arsenide, gallium phosphide, indium phosphide, indium arsenide, an alloy semiconductor, such as SiGe, or GaAsP, or a combination thereof, in accordance with some embodiments.

The nanostructures 122, 124, 126, and 128 are made of a same second material, in accordance with some embodiments. The second material is different from the first material, in accordance with some embodiments. The second material is the same as the material of the substrate 110, in accordance with some embodiments. The second material is made of an elementary semiconductor material including silicon or germanium in a single crystal, polycrystal, or amorphous structure, in accordance with some embodiments.

The second material is made of a compound semiconductor, such as silicon carbide, gallium arsenide, gallium phosphide, indium phosphide, indium arsenide, an alloy semiconductor, such as SiGe, or GaAsP, or a combination thereof, in accordance with some embodiments.

As shown in FIG. 1A, an isolation layer 130 is formed over the base 112, in accordance with some embodiments. The fin 114 is partially embedded in the isolation layer 130, in accordance with some embodiments. The fin 114 is surrounded by the isolation layer 130, in accordance with some embodiments.

The isolation layer 130 has an upper portion 132 adjacent to the fin 114, in accordance with some embodiments. The upper portion 132 has a width W132 increasing toward the base 112, in accordance with some embodiments. The upper portion 132 has a thickness T132 increasing toward the fin 114, in accordance with some embodiments. The upper portion 132 has sloped sidewalls 132a, in accordance with some embodiments.

The isolation layer 130 is made of oxide (such as silicon dioxide), in accordance with some embodiments. The formation of the isolation layer 130 includes depositing an isolation material layer (not shown) over the substrate 110; performing a planarization process over the isolation material layer; and performing an etching back process over the isolation material layer, in accordance with some embodiments. The depositing process includes a chemical vapor deposition process, in accordance with some embodiments. The planarization process includes a chemical mechanical polishing process, in accordance with some embodiments. Since it is hard to remove the isolation material layer adjacent to the fin 114, the thickness T132 of the upper portion 132 increases toward the fin 114, in accordance with some embodiments.

Figure 1B:
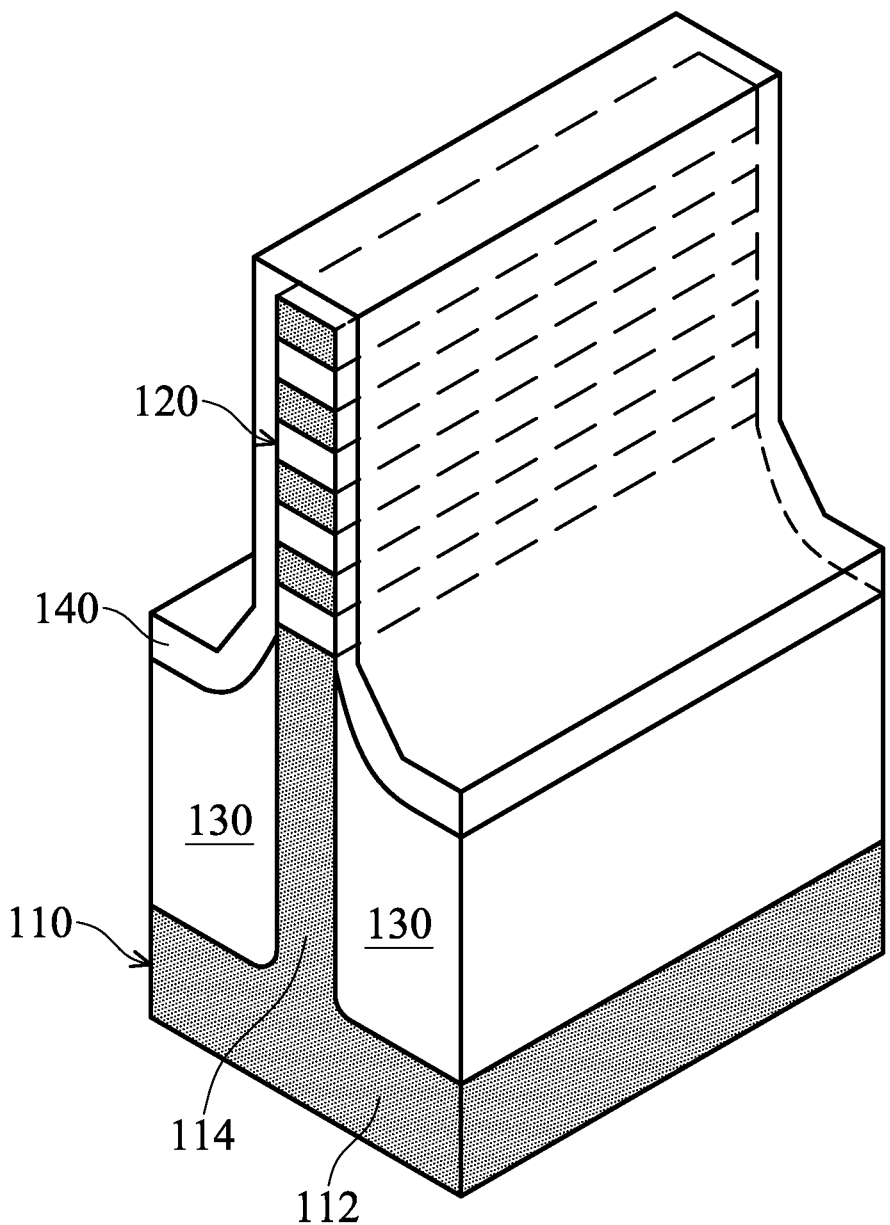

As shown in FIG. 1B, a gate dielectric layer 140 is formed over the fin 114, the nanostructure stack 120, and the isolation layer 130, in accordance with some embodiments. The gate dielectric layer 140 is made of oxides (e.g., silicon dioxides) or another suitable insulating material. The gate dielectric layer 140 is formed using a chemical vapor deposition (CVD) process, a physical vapor deposition (PVD) process, an atomic layer deposition (ALD) process, a high density plasma CVD (HDPCVD) process, a metal organic CVD (MOCVD) process, or a plasma enhanced CVD (PECVD) process, in accordance with some embodiments.

Figure 1C:
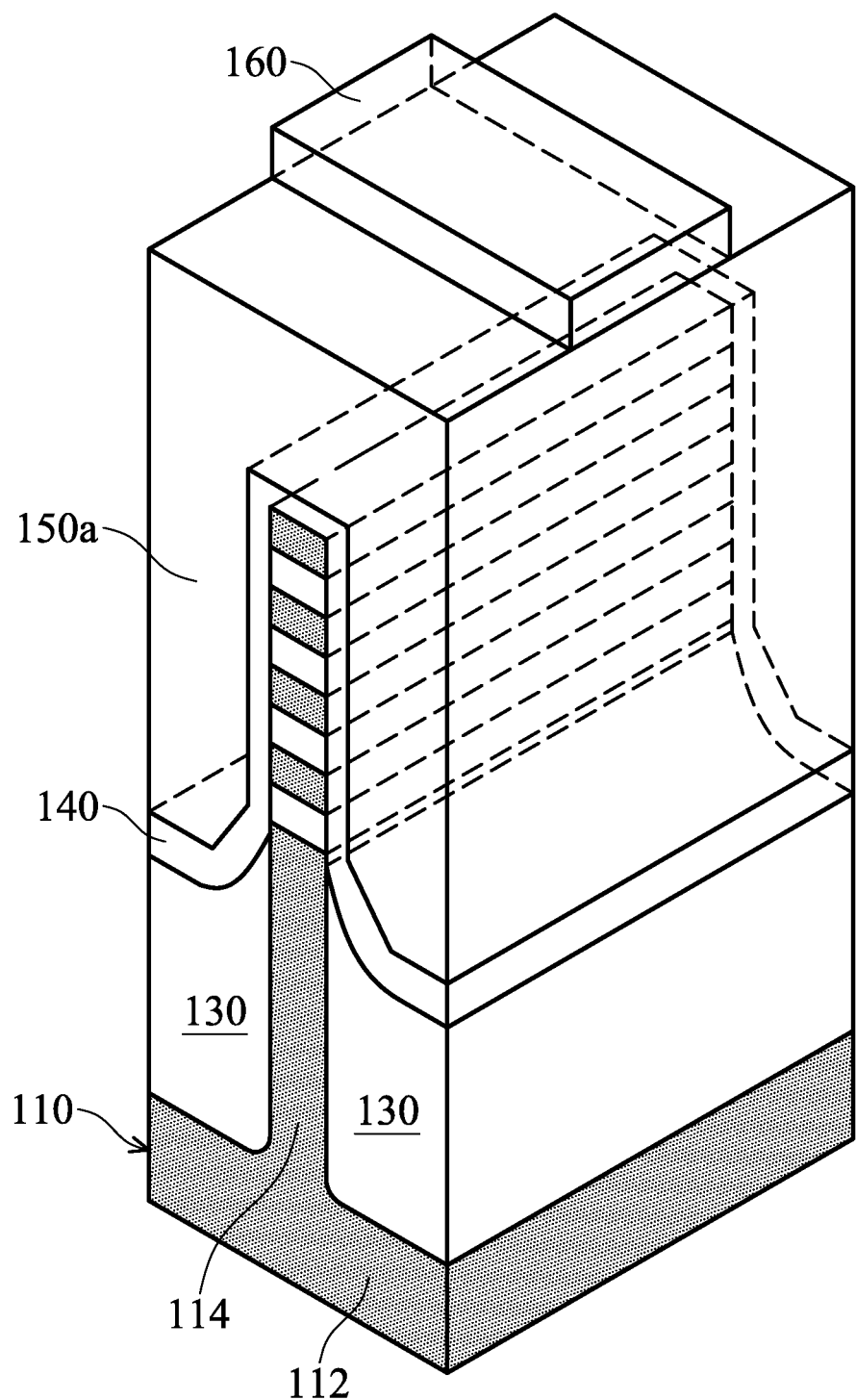

As shown in FIG. 1C, a gate electrode material layer 150a is formed over the gate dielectric layer 140, in accordance with some embodiments. The gate electrode material layer 150a may include a single layer or multilayer structure. In some embodiments, the gate electrode material layer 150a is made of polysilicon. The gate electrode material layer 150a may be formed by a deposition processes.

The deposition processes may include a chemical vapor deposition (CVD) process, a physical vapor deposition (PVD) process, an atomic layer deposition (ALD) process, a high density plasma CVD (HDPCVD) process, a metal organic CVD (MOCVD) process, or a plasma enhanced CVD (PECVD) process, in accordance with some embodiments.

As shown in FIG. 1C, a mask layer 160 is formed over the gate electrode material layer 150a, in accordance with some embodiments. The mask layer 160 exposes a portion of the gate electrode material layer 150a, in accordance with some embodiments. The mask layer 160 is made of a material different form the materials of the gate electrode material layer 150a and the gate dielectric layer 140, in accordance with some embodiments. The mask layer 160 is made of nitrides, such as silicon nitride, or oxynitride, such as silicon oxynitride, in accordance with some embodiments.

Figure 1D:
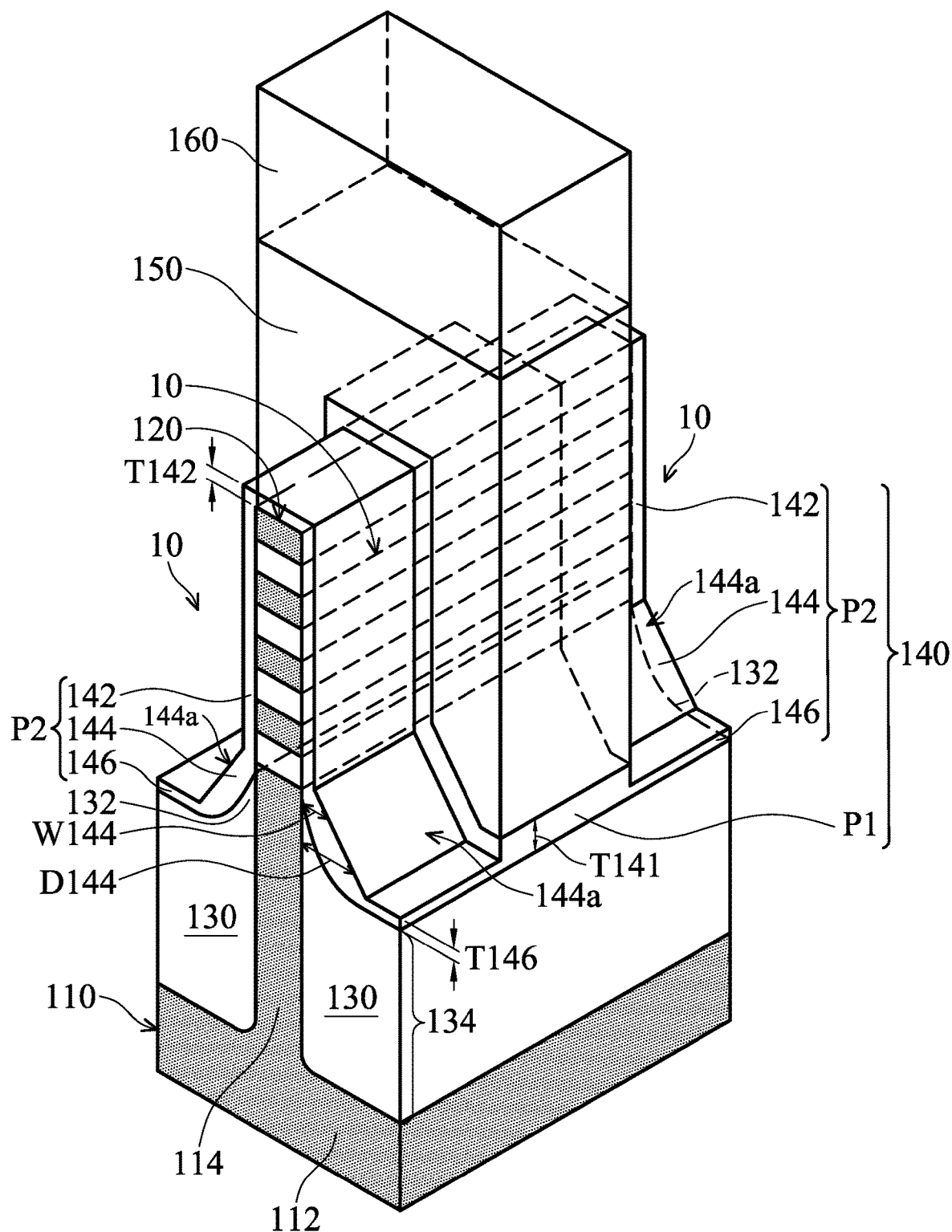

As shown in FIG. 1D, the portion of the gate electrode material layer 150a exposed by the mask layer 160 is removed, in accordance with some embodiments. The remaining gate electrode material layer 150a forms a gate electrode layer 150, in accordance with some embodiments.

The removal process forms recesses 10, in accordance with some embodiments. Each recess 10 is surrounded by the gate dielectric layer 140 and the gate electrode layer 150, in accordance with some embodiments. The recesses 10 are on opposite sides of the fin 114, in accordance with some embodiments. The removal process includes an anisotropic etching process, such as a dry etching process (e.g., a plasma etching process), in accordance with some embodiments.

As shown in FIG. 1D, the gate dielectric layer 140 originally under the removed portion of the gate electrode material layer 150a is partially removed or thinned, in accordance with some embodiments. The removal process includes an anisotropic etching process, such as a dry etching process (e.g., a plasma etching process), in accordance with some embodiments.

After the removal process, the gate dielectric layer 140 has parts P1 and P2, in accordance with some embodiments. The gate electrode layer 150 is over the part P1, in accordance with some embodiments. The part P2 has an upper portion 142, a lower portion 144, and a horizontal portion 146, in accordance with some embodiments. The upper portion 142 covers the nanostructure stack 120, in accordance with some embodiments. The lower portion 144 covers the fin 114 and the upper portion 132 of the isolation layer 130, in accordance with some embodiments. The horizontal portion 146 covers a lower portion 134 of the isolation layer 130, in accordance with some embodiments. The lower portion 144 has a width W144 that increases toward the base 112, in accordance with some embodiments. The width W144 continuously increases toward the base 112, in accordance with some embodiments. The lower portion 144 has a sloped sidewall 144a, in accordance with some embodiments.

In some embodiments, a distance D144 between the sloped sidewall 144a and the fin 114 increases toward the base 112. The distance D144 between the sloped sidewall 144a and the fin 114 continuously increases toward the base 112, in accordance with some embodiments.

The part P1 is thicker than the upper portion 142, in accordance with some embodiments. That is, the thickness T141 of the part P1 is greater than the thickness T142 of the upper portion 142, in accordance with some embodiments. The part P1 is thicker than the horizontal portion 146, in accordance with some embodiments. That is, the thickness T141 is greater than the thickness T146 of the horizontal portion 146, in accordance with some embodiments.

Figure 1E:
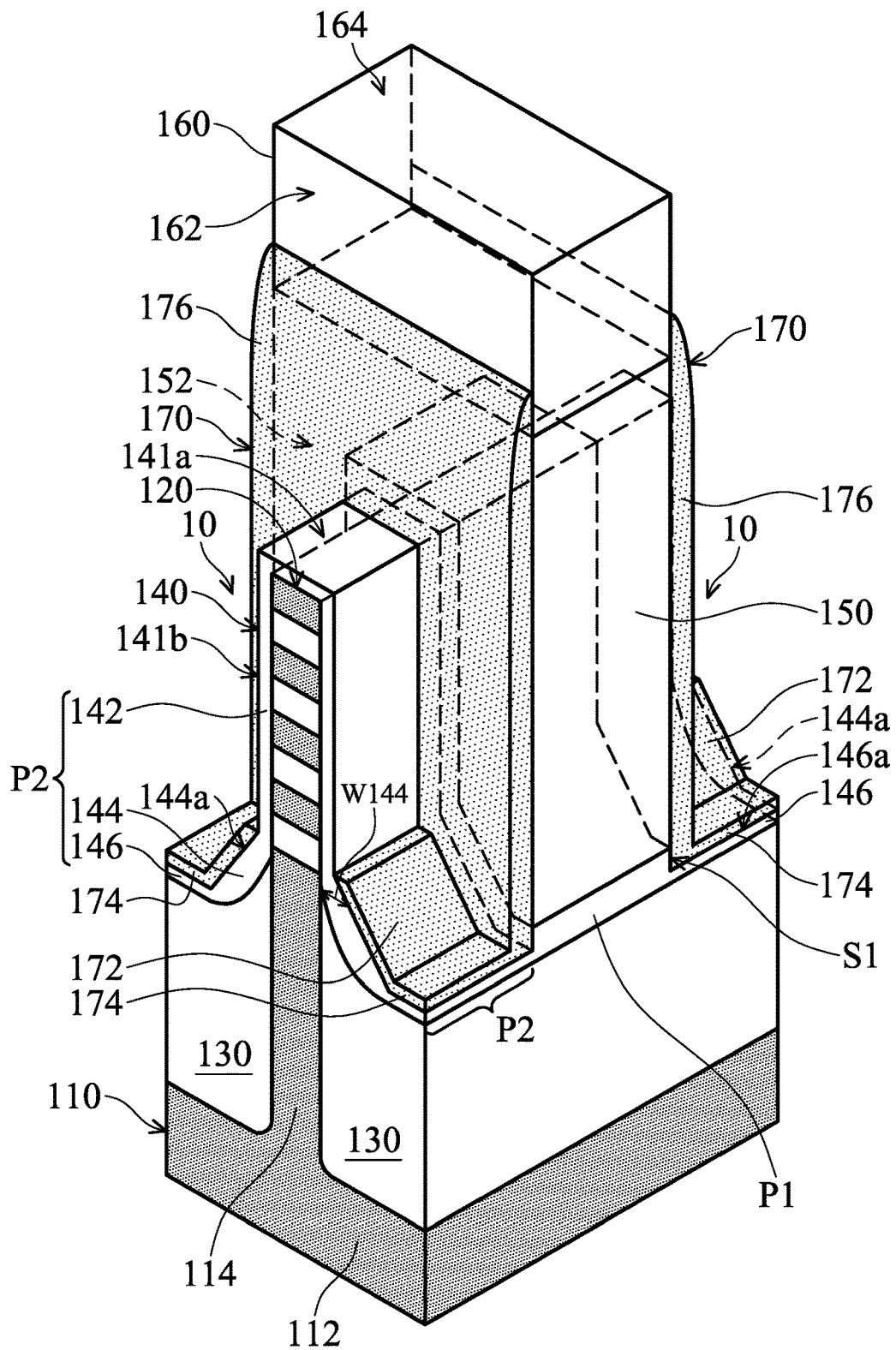

As shown in FIG. 1E, a spacer layer 170 is formed over a sidewall 162 of the mask layer 160, a sidewall 152 of the gate electrode layer 150, a sidewall S1 of the part P1, the sloped sidewall 144a of the lower portion 144, and a top surface 146a of the horizontal portion 146, in accordance with some embodiments. The spacer layer 170 conformally covers the sloped sidewall 144a, in accordance with some embodiments.

The spacer layer 170 has a sloped portion 172, a horizontal portion 174, and a vertical portion 176, in accordance with some embodiments. The sloped portion 172 covers the lower portion 144, in accordance with some embodiments. The horizontal portion 174 covers the horizontal portion 146, in accordance with some embodiments.

The vertical portion 176 covers the sidewalls 162, 152, and S1, in accordance with some embodiments. The vertical portion 176 is thicker than the sloped portion 172, in accordance with some embodiments. The sloped portion 172 is thicker than the horizontal portion 174, in accordance with some embodiments.

The spacer layer 170 is made of an insulating material, such as silicon oxide, silicon nitride, silicon oxynitride, or silicon carbide, in accordance with some embodiments. The formation of the spacer layer 170 includes depositing a spacer material layer (not shown) over the mask layer 160, the gate electrode layer 150, and the gate dielectric layer 140; and performing an anisotropic etching process over the spacer material layer to partially remove the spacer material layer, in accordance with some embodiments.

The anisotropic etching process removes portions of the spacer material layer over top surfaces 164 and 141a of the mask layer 160 and the gate dielectric layer 140 firstly and then removes upper portions of the spacer material layer over sidewalls 162 and 141b of the mask layer 160 and the gate dielectric layer 140, in accordance with some embodiments. After the anisotropic etching process, the spacer material layer is remained over the sidewalls 162 and 152 of the mask layer 160 and the gate electrode layer 150 and bottoms of the recesses 10, in accordance with some embodiments. Since the etching element (e.g. an etching plasma) of the anisotropic etching process is hard to reach the bottoms of the recesses 10, the etching rate of the spacer material layer over the bottoms is lower than that of the spacer material layer over the upper portion of the sidewalls 141b, in accordance with some embodiments.

Figure 1F:
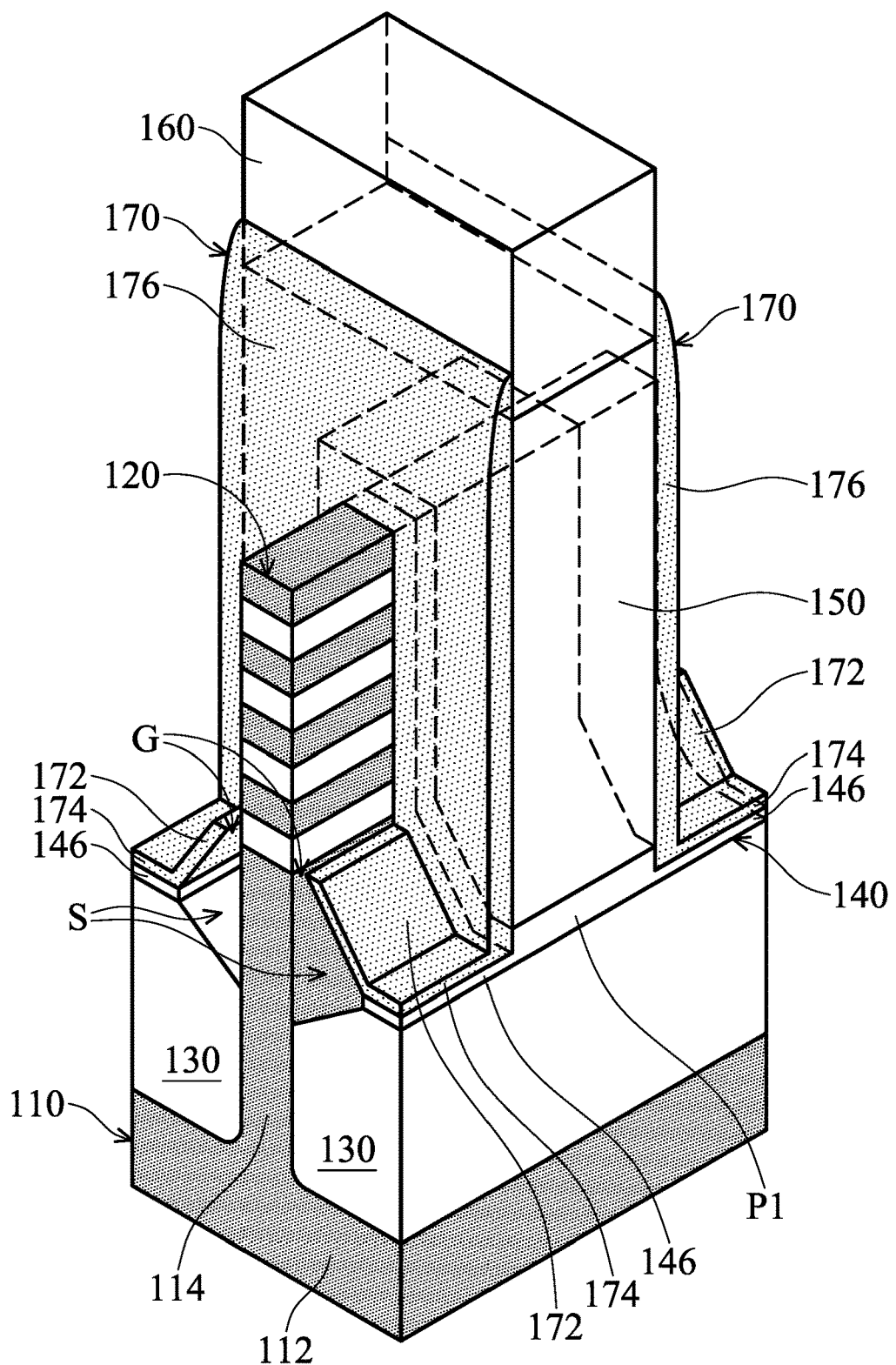

As shown in FIG. 1F, the upper portion 142 and the lower portion 144 of the gate dielectric layer 140 and a portion of the isolation layer 130 under the lower portion 144 are removed, in accordance with some embodiments. After the removal process, spaces S are formed between the sloped portion 172 and the fin 114 and between the isolation layer 130 and the fin 114, in accordance with some embodiments. The removal process includes etching processes, such as a dry etching process and a chemical etching process, in accordance with some embodiments. The dry etching process includes an anisotropic etching process, such as a plasma etching process, in accordance with some embodiments. The chemical etching process includes an isotropic etching process, such as a wet etching process or a gas-phase etching process, in accordance with some embodiments.

In some embodiments, as shown in FIGS. 1E and 1F, the upper portion 142 of the gate dielectric layer 140 is removed using the anisotropic etching process, and the lower portion 144 of the gate dielectric layer 140 and the portion of the isolation layer 130 thereunder are removed using the isotropic etching process. Since the etching rate of the anisotropic etching process is greater than that of the isotropic etching process, the upper portion 142 of the gate dielectric layer 140 is removed using a anisotropic etching process, in accordance with some embodiments. The gap G between the sloped portion 172 of the spacer layer 170 and the nanostructure stack 120 is narrow, which may decrease the etching rate of the anisotropic etching process. The etchant of the isotropic etching process may easily pass through the gap G. Therefore, the isotropic etching process is used to remove the structures under the sloped portion 172 (i.e. the lower portion 144 and the isolation layer 130 thereunder), in accordance with some embodiments.

Figure 1G:
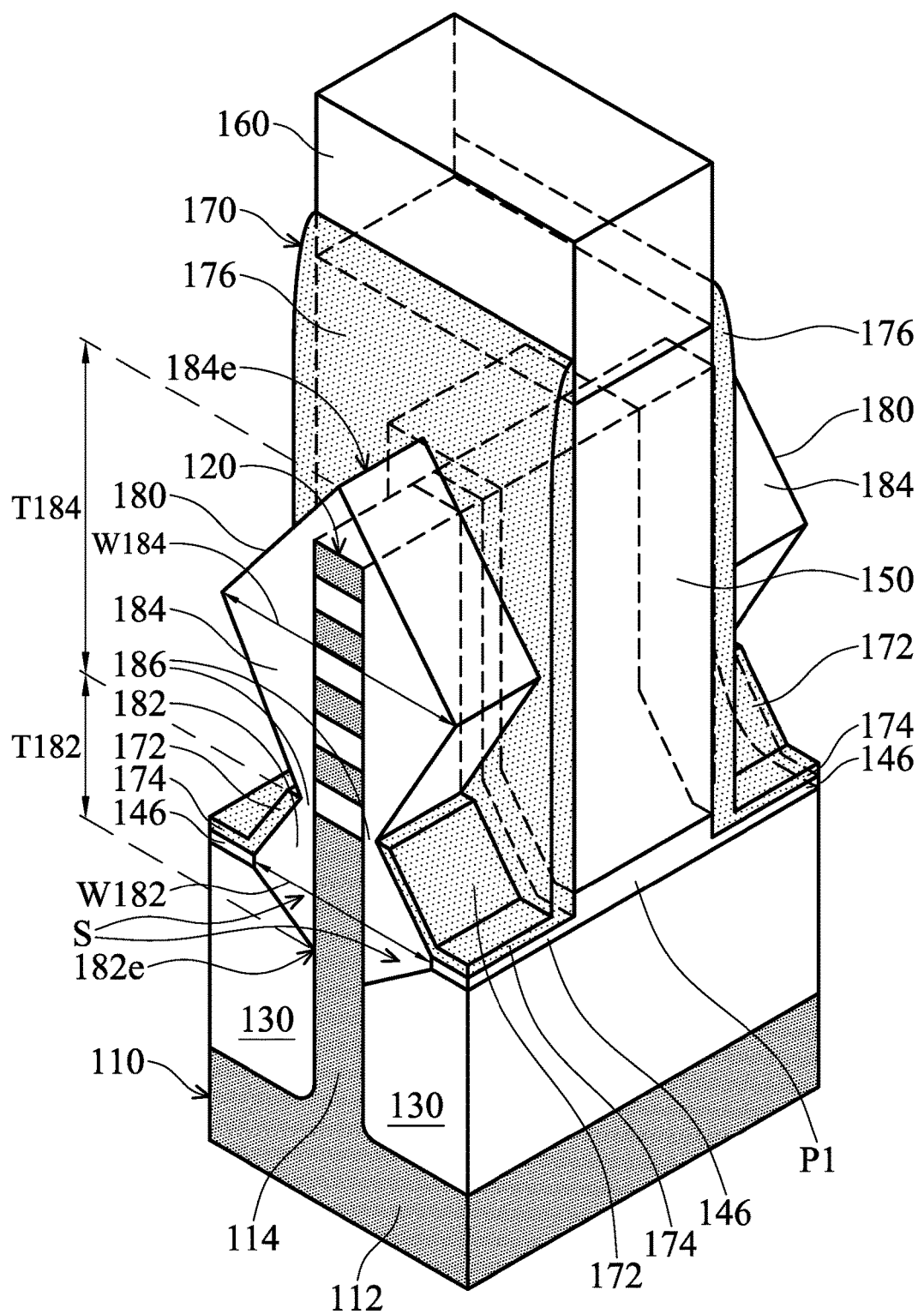

As shown in FIG. 1G, source/drain structures 180 are formed in the spaces S and over the fin 114 and the nanostructure stack 120, in accordance with some embodiments. The source/drain structures 180 are in direct contact with the fin 114 and the nanostructure stack 120, in accordance with some embodiments. The fin 114 and the nanostructure stack 120 pass through the source/drain structures 180, in accordance with some embodiments.

Since the growth of the source/drain structures 180 is partially constrained by the sloped portion 172 of the spacer layer 170, the source/drain structures 180 has a double-diamond-like shape, in accordance with some embodiments. Specifically, each source/drain structure 180 has a lower portion 182, an upper portion 184, and a neck portion 186, in accordance with some embodiments. The neck portion 186 is connected between the upper portion 184 and the lower portion 182, in accordance with some embodiments. The upper portion 184 is positioned outside of any of the spaces S, in accordance with some embodiments. The upper portion 184 has a diamond-like shape, in accordance with some embodiments.

The lower portion 182 is in the corresponding space S, in accordance with some embodiments. The lower portion 182 has a diamond-like shape, in accordance with some embodiments. The lower portion 182 is partially embedded in the isolation layer 130, in accordance with some embodiments. The upper portion 184 is wider than the neck portion 186, in accordance with some embodiments. The lower portion 182 is wider than the neck portion 136, in accordance with some embodiments.

In some embodiments, a width W184 of the upper portion 184 decreases toward the neck portion 186. The width W184 also decreases toward a top end 184e of the upper portion 184, in accordance with some embodiments. In some embodiments, a width W182 of the lower portion 182 decreases toward the neck portion 186. The width W182 also decreases toward a bottom end 182e of the lower portion 182, in accordance with some embodiments.

The upper portion 184 is wider than the lower portion 182, in accordance with some embodiments. That is, the maximum width of the upper portion 184 is greater than the maximum width of the lower portion 182, in accordance with some embodiments. The upper portion 184 is thicker than the lower portion 182, in accordance with some embodiments. That is, the maximum thickness T184 of the upper portion 184 is greater than the maximum thickness T182 of the lower portion 182, in accordance with some embodiments.

In some embodiments, the source/drain structures 180 are made of a semiconductor material (e.g., silicon germanium), in accordance with some embodiments. The source/drain structures 180 may have P-type dopants, such as the Group IIIA element. The Group IIIA element includes boron or another suitable material.

In some other embodiments, the source/drain structures 180 are made of a semiconductor material (e.g., silicon), in accordance with some embodiments. The source/drain structures 180 may have N-type dopants, such as the Group VA element. The Group VA element includes phosphor (P), antimony (Sb), or another suitable Group VA material. The source/drain structures 180 are formed using an epitaxial process, in accordance with some embodiments.

Figure 1H:
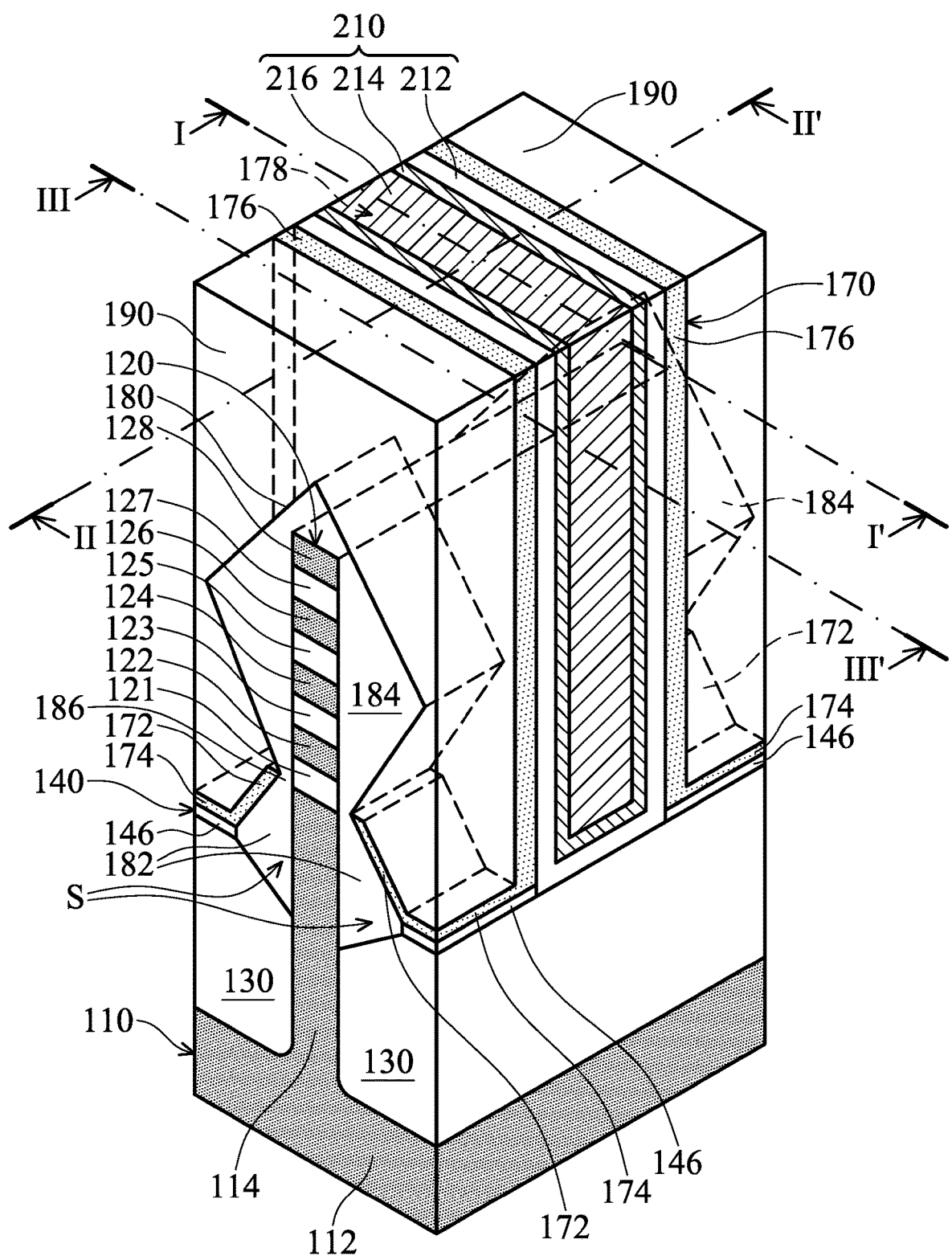
Figure 2A:
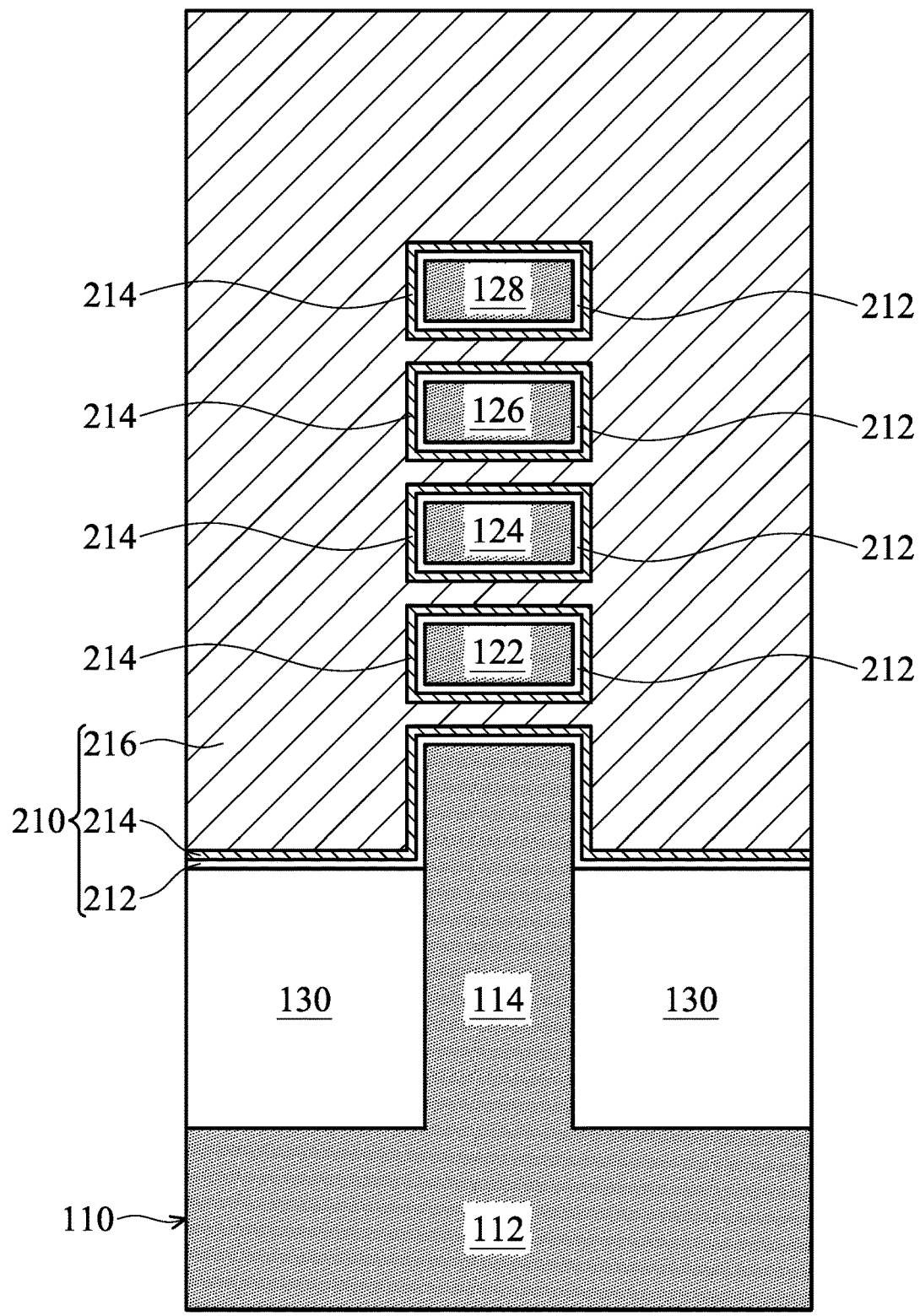
FIG. 2A is a cross-sectional view illustrating the semiconductor device structure along a sectional line I-I' in FIG. 1H, in accordance with some embodiments.
Figure 2B:
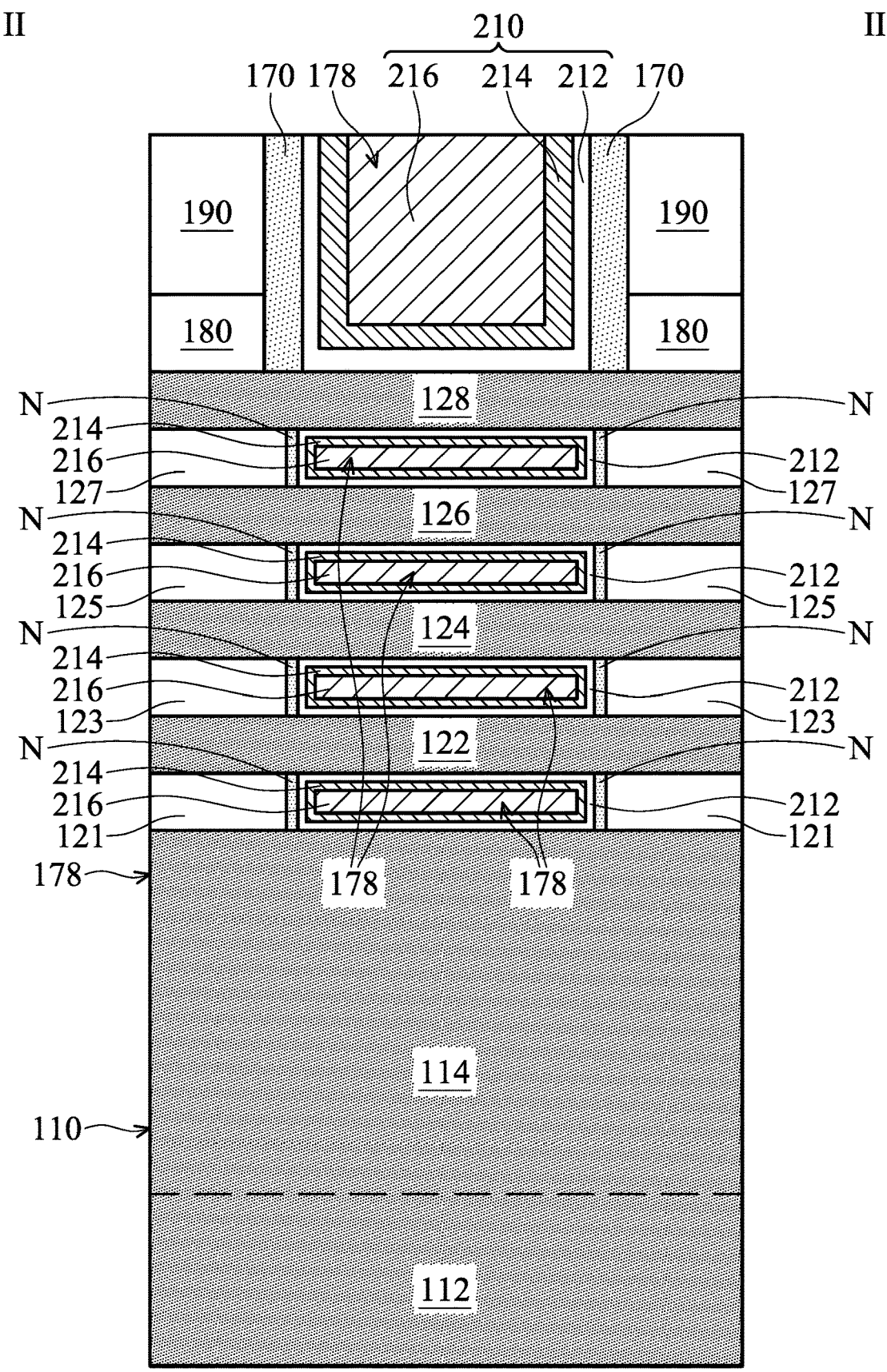
FIG. 2B is a cross-sectional view illustrating the semiconductor device structure along a sectional line II-II' in FIG. 1H, in accordance with some embodiments.
Figure 3A:
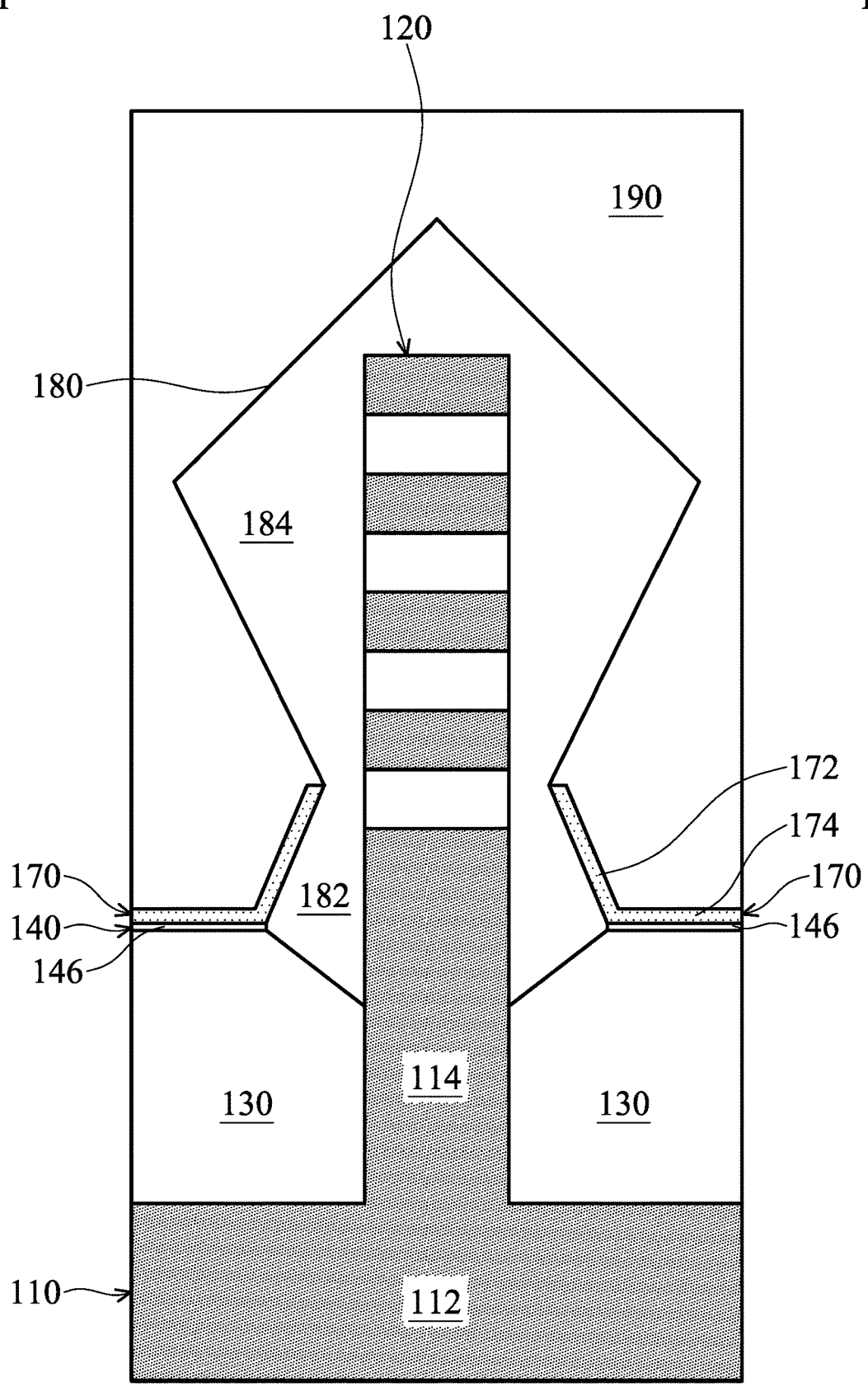
FIGS. 3A-3B are cross-sectional views of various stages of a process for forming a semiconductor device structure, in accordance with some embodiments.

FIG. 2A is a cross-sectional view illustrating the semiconductor device structure along a sectional line I-I' in FIG. 1H, in accordance with some embodiments. FIG. 2B is a cross-sectional view illustrating the semiconductor device structure along a sectional line II-II' in FIG. 1H, in accordance with some embodiments. FIG. 3A is a cross-sectional view illustrating the semiconductor device structure along a sectional line III-III' in FIG. 1H, in accordance with some embodiments.

In some embodiments, a dielectric material layer (not shown) is formed over the source/drain structures 180 and the spacer layer 170 of FIG. 1G, in accordance with some embodiments. As shown in FIG. 1H, the mask layer 160 and upper portions of the spacer layer 170 and the dielectric material layer are removed, in accordance with some embodiments. The remaining dielectric material layer forms a dielectric layer 190, in accordance with some embodiments.

As shown in FIGS. 1H, 2B, and 3A, the dielectric layer 190 is over the source/drain structures 180 and the spacer layer 170, in accordance with some embodiments. The dielectric layer 190 includes an oxide-containing material such as silicon oxide, in accordance with some embodiments. The removal process includes a planarization process, such as a chemical mechanical polishing process, in accordance with some embodiments.

As shown in FIG. 1H, the gate electrode layer 150 and the part P1 of the gate dielectric layer 140 are removed to form a trench 173 in the spacer layer 170, in accordance with some embodiments. The trench 178 exposes the nanostructure stack 120, in accordance with some embodiments.

As shown in FIGS. 1H and 2B, the nanostructures 121, 123, 125 and 127 exposed by the trench 178 are removed, in accordance with some embodiments. As shown in FIG. 2B, an inner spacer layer N is formed over end portions of the nanostructures 121, 123, 125, and 127 adjacent to the trench 178, in accordance with some embodiments.

The inner spacer layer N is made of an insulating material, such as silicon oxide, silicon nitride, silicon oxynitride, or silicon carbide, in accordance with some embodiments. The inner spacer layer N is formed by performing an oxidation process over the end portions of the nanostructures 121, 123, 125, and 127 through the trench 178, in accordance with some embodiments. In some other embodiments, the inner spacer layer N is formed using a deposition process (e.g., an atomic layer deposition process) and an etching process.

As shown in FIG. 1H, a gate structure 210 is formed in the trench 178, in accordance with some embodiments. As shown in FIG. 2A, the gate structure 210 wraps around the nanostructures 122, 124, 126, and 123 and an upper portion of the fin 114, in accordance with some embodiments. The gate structure 210 includes a gate dielectric layer 212, a work function metal layer 214, and a gate electrode layer 216, in accordance with some embodiments.

The gate dielectric layer 212 conformally covers inner walls and a bottom surface of the trench 178, in accordance with some embodiments. The gate dielectric layer 212 is made of a high-K material, such as $HfO_2$, $ZrO_2$, $HfZrO_2$, or $Al_2O_3$, or another suitable dielectric material. The term "high-k material" means a material having a dielectric constant greater than the dielectric constant of silicon dioxide, in accordance with some embodiments. The gate dielectric layer 212 is formed using an atomic layer deposition process or another suitable process.

The work function metal layer 214 is conformally formed over the gate dielectric layer 212, in accordance with some embodiments. The work function metal layer 214 is made of TiN, TaN, TiSiN, or another suitable conductive material. The work function metal layer 214 is formed using an atomic layer deposition process, in accordance with some embodiments.

The gate electrode layer 216 is formed over the work function metal layer 214, in accordance with some embodiments. The gate electrode layer 216 is made of W, Co, Al, or another suitable conductive material. The gate electrode layer 216 is formed using an atomic layer deposition process or another suitable process.

Figure 3B:
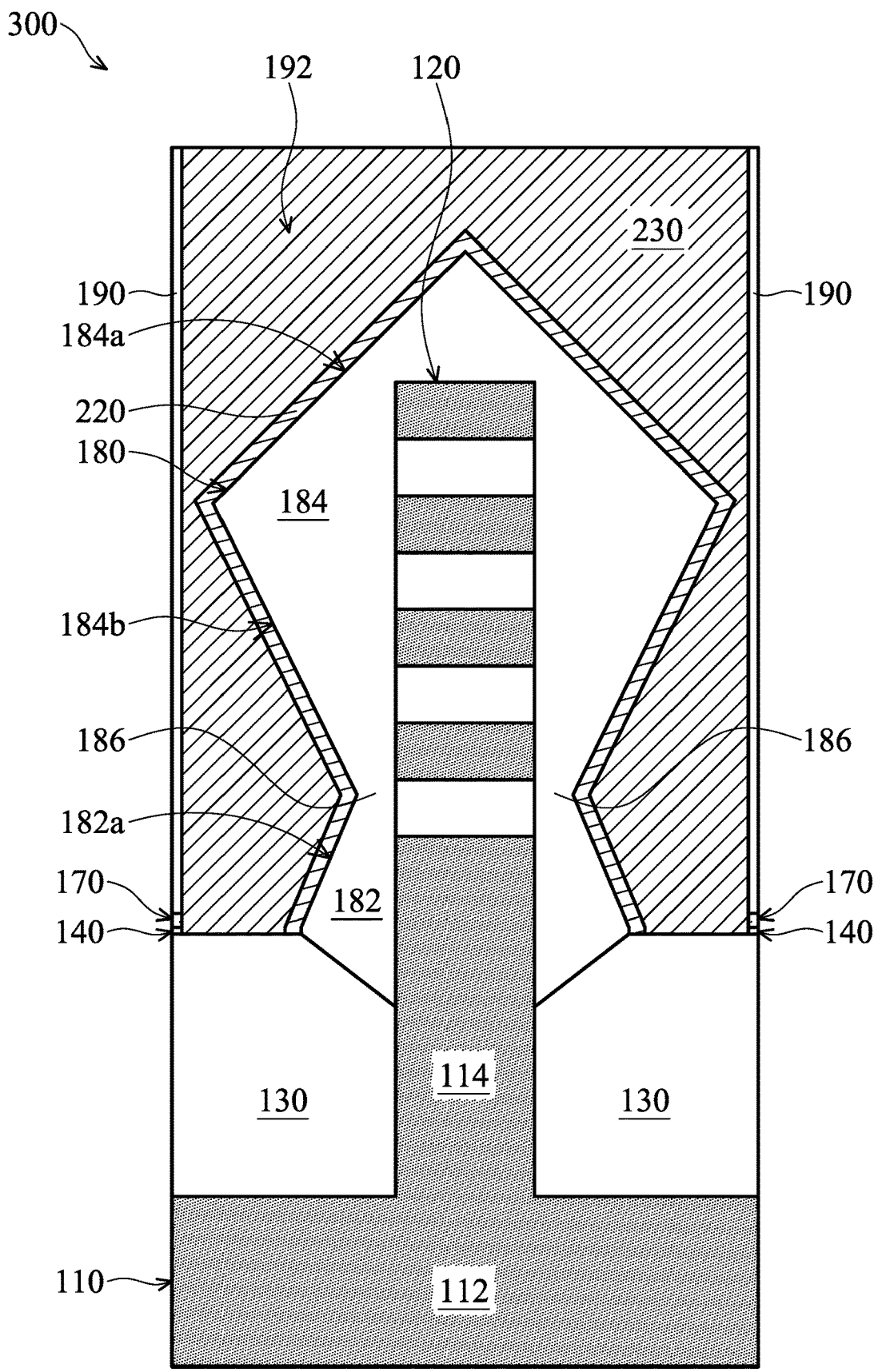

FIGS. 3A-3B are cross-sectional views of various stages of a process for forming a semiconductor device structure, in accordance with some embodiments. As shown in FIG. 3B, portions of the dielectric layer 190, the spacer layer 170, and the gate dielectric layer 140 adjacent to the source/drain structures 180 are removed to form contact holes 192, in accordance with some embodiments.

The contact holes 192 pass through the dielectric layer 190, the spacer layer 170, and the gate dielectric layer 140, in accordance with some embodiments. The contact holes 192 expose the source/drain structures 180, in accordance with some embodiments.

The upper portion 184 of the source/drain structure 180 has upper surfaces 184a and lower surfaces 184b, in accordance with some embodiments. The lower portion 182 of the source/drain structure 180 has upper surfaces 182a, in accordance with some embodiments. The contact holes 192 expose the upper surfaces 182a and 184a and the lower surfaces 184b, in accordance with some embodiments. The contact holes 192 are formed using a dry etching process, such as an anisotropic etching process (e.g., a plasma etching process), in accordance with some embodiments.

As shown in FIG. 3B, a silicide layer 220 is formed over the source/drain structures 180, in accordance with some embodiments. The silicide layer 220 conformally covers the source/drain structures 180, in accordance with some embodiments. The silicide layer 220 covers an entire exterior surface of each source/drain structure 180, such as the upper surfaces 182a and 184a and the lower surfaces 184b, in accordance with some embodiments.

The silicide layer 220 is made of a silicide material of a suitable metal material, in accordance with some embodiments. The suitable metal material may include cobalt (Co), nickel (Ni), platinum (Pt), titanium (Ti), ytterbium (Yb), molybdenum (Mo), erbium (Er), or a combination thereof.

As shown in FIG. 3B, contact structures 230 are formed in the contact holes 192, in accordance with some embodiments. The contact structures 230 are in direct contact with the silicide layer 220, in accordance with some embodiments. The contact structures 230 pass through the dielectric layer 190, the spacer layer 170, and the gate dielectric layer 140, in accordance with some embodiments.

Each contact structure 230 wraps around the silicide layer 220 and the corresponding source/drain structure 180, in accordance with some embodiments. Each contact structure 230 wraps around the upper portion 184, the neck portion 186, and the lower portion 182 of the corresponding source/drain structure 180, in accordance with some embodiments.

The contact structures 230 are made of a metal material (e.g., tungsten, aluminum, gold, silver, or a combination thereof), an alloy thereof, or another suitable conductive material. The contact structures 230 are formed using a physical vapor deposition process, a chemical vapor deposition process, or another suitable process. In this step, a semiconductor device structure 300 is substantially formed, in accordance with some embodiments.

Since the source/drain structure 180 has the neck portion 186, the maximum width of the source/drain structure 180 is reduced (in compared with that of a source/drain structure without the neck portion and having the same height), in accordance with some embodiments. Therefore, the formation of the neck portion 186 is able to constrain the maximum width of the source/drain structure 180 to prevent adjacent two source/drain structures 180 from short circuit, in accordance with some embodiments.

The formation of the neck portion 186 is able to increase the surface area of the source/drain structure 180, in accordance with some embodiments. Therefore, the contact area between the silicide layer 220 and the source/drain structure 180 and the contact area between the silicide layer 220 and the contact structure 230 are both increased, in accordance with some embodiments. As a result, the resistance between the contact structure 230 and the source/drain structure 180 is reduced, which improves the performance of the semiconductor device structure 300, in accordance with some embodiments.

Figure 4A:
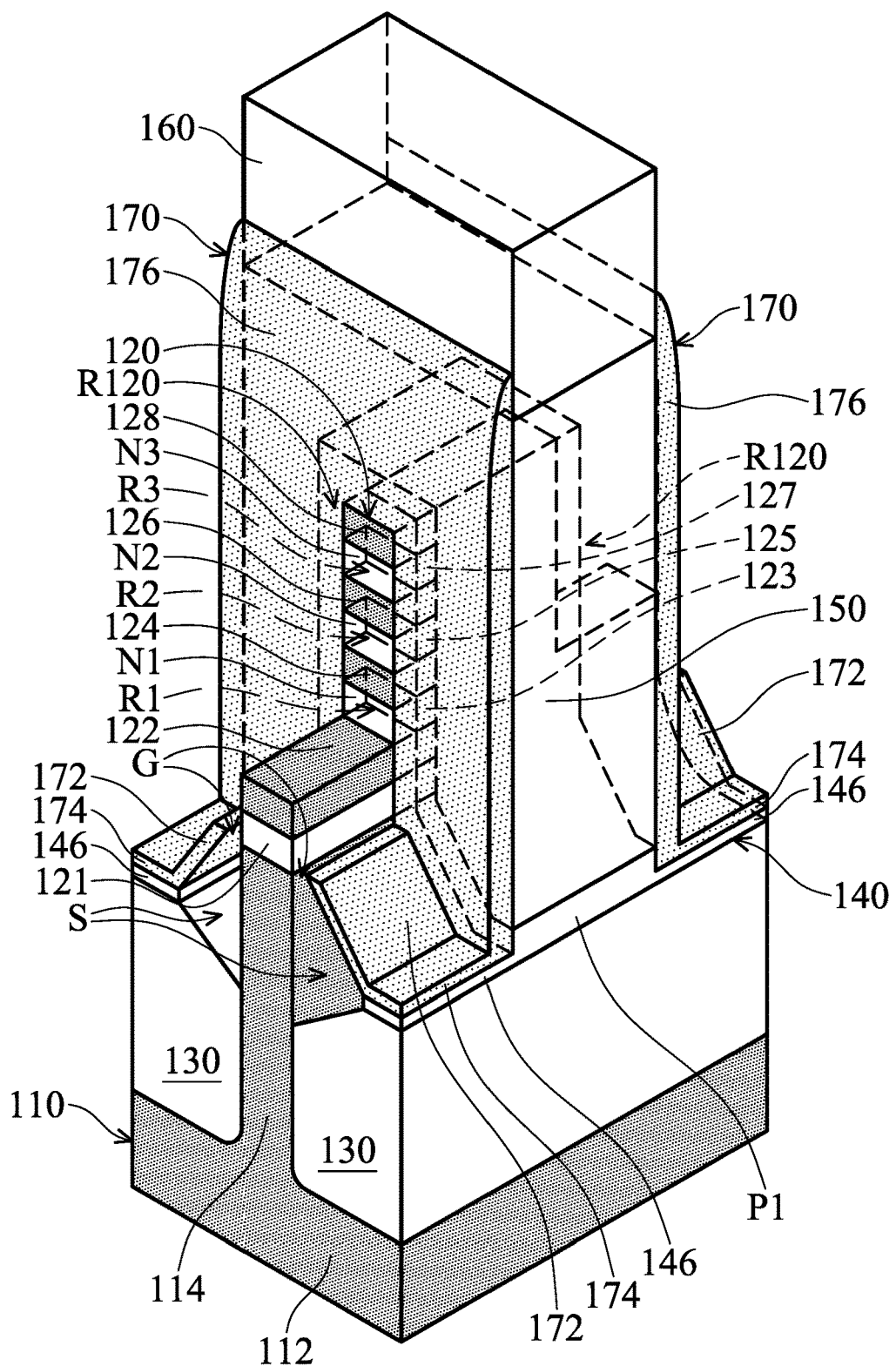
FIGS. 4A-4C are perspective views of various stages of a process for forming a semiconductor device structure, in accordance with some embodiments.
Figure 4B:
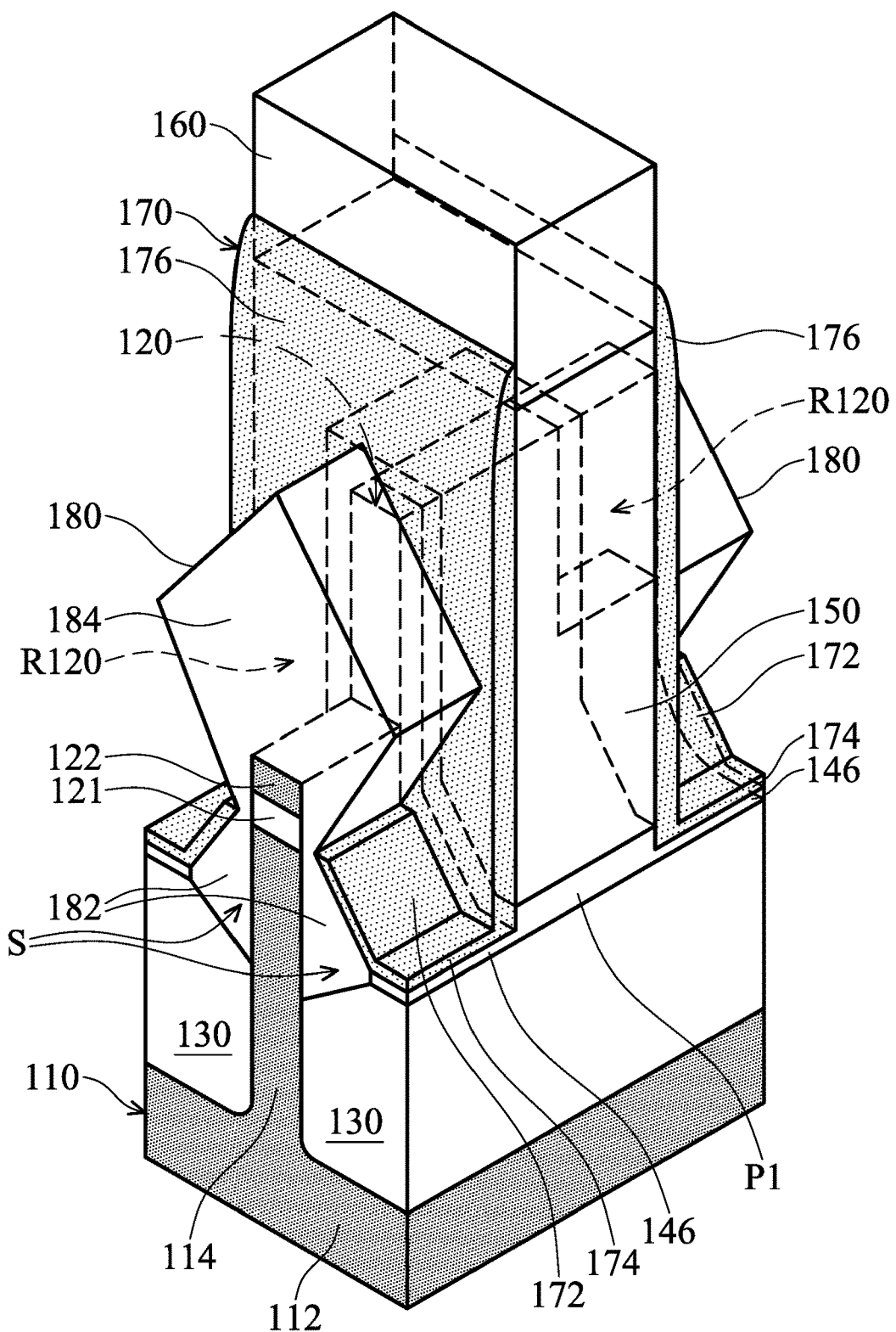
Figure 4C:
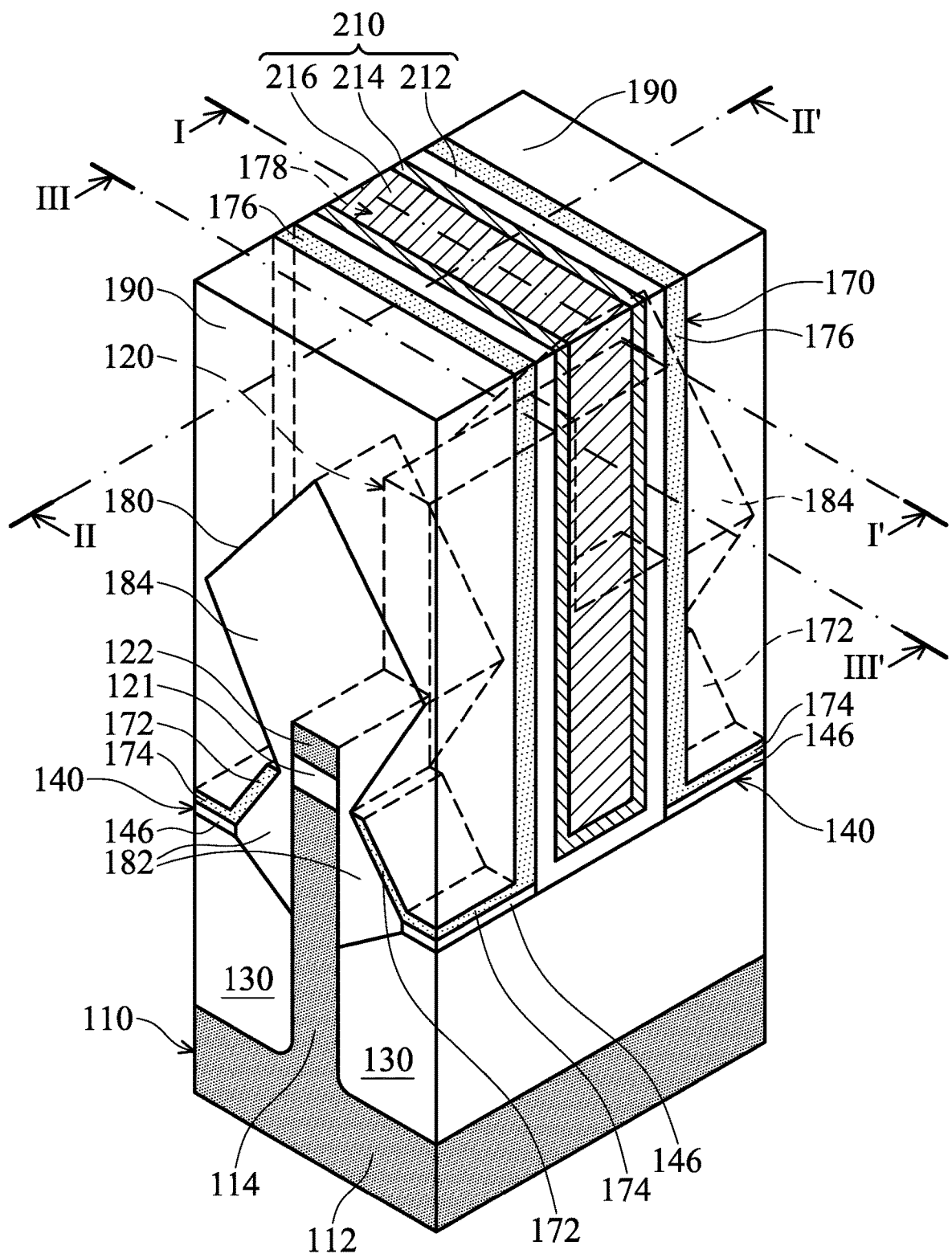

FIGS. 4A-4C are perspective views of various stages of a process for forming a semiconductor device structure, in accordance with some embodiments. As shown in FIG. 4A, after the step of FIG. 1E, the upper portion 142 of the gate dielectric layer 140, end portions of the nanostructures 123, 124, 125, 126, 127, and 128, which are not covered by the spacer layer 170 and the gate electrode layer 150, the lower portion 144 of the gate dielectric layer 140, and a portion of the isolation layer 130 under the lower portion 144, are removed, in accordance with some embodiments.

The removal process includes etching processes, such as a dry etching process and a chemical etching process, in accordance with some embodiments. The dry etching process includes an anisotropic etching process, such as a plasma etching process, in accordance with some embodiments. The chemical etching process includes an isotropic etching process, such as a wet etching process or a gas-phase etching process, in accordance with some embodiments.

Specifically, as shown in FIGS. 1E and 4A, the upper portion 142 of the gate dielectric layer 140 and the end portions of the nanostructures 123, 124, 125, 126, 127, and 128, which are not covered by the spacer layer 170 and the gate electrode layer 150, are removed using a dry etching process. The lower portion 144 of the gate dielectric layer 140 and the portion of the isolation layer 130 thereunder are removed using the chemical etching process, in accordance with some embodiments.

After the removal process, the fin 114, the nanostructures 121 and 122, and central portions of the nanostructures 123, 124, 125, 126, 127, and 128 are remained, in accordance with some embodiments. The removal process forms recesses R120 in the nanostructure stack 120 and on two opposite sides of the gate electrode layer 150, in accordance with some embodiments.

As shown in FIG. 4A, the nanostructures 123, 125, and 127 under the spacer layer 170 are removed to form recesses R1, R2, and R3 in the nanostructure stack 120, in accordance with some embodiments. The recess R1 is between the nanostructures 122 and 124, in accordance with some embodiments. The recess R2 is between the nanostructures 124 and 126, in accordance with some embodiments. The recess R3 is between the nanostructures 126 and 128, in accordance with some embodiments.

As shown in FIG. 4A, inner spacers N1, N2, and N3 are respectively formed in the recesses R1, R2, and R3, in accordance with some embodiments. In some embodiments, the inner spacers N1, N2, and N3 are made of an oxide-containing insulating material, such as silicon oxide.

In some other embodiments, the inner spacers N1, N2, and N3 are made of a nitride-containing insulating material, such as silicon nitride (SiN), silicon oxynitride (SiON), silicon oxycarbonitride (SiOCN), or silicon carbonitride (SiCN). The inner spacers N1, N2, and N3 are formed using a deposition process, such as a chemical vapor deposition process or a physical vapor deposition process, and an etching process, in accordance with some embodiments.

As shown in FIG. 4B, source/drain structures 180 are formed in the spaces S and the recesses R120 of the nanostructure stack 120, in accordance with some embodiments. The source/drain structures 180 are in direct contact with the fin 114 and the nanostructure stack 120, in accordance with some embodiments. The fin 114 and the nanostructures 121 and 122 pass through the source/drain structures 180, in accordance with some embodiments.

Figure 5A:
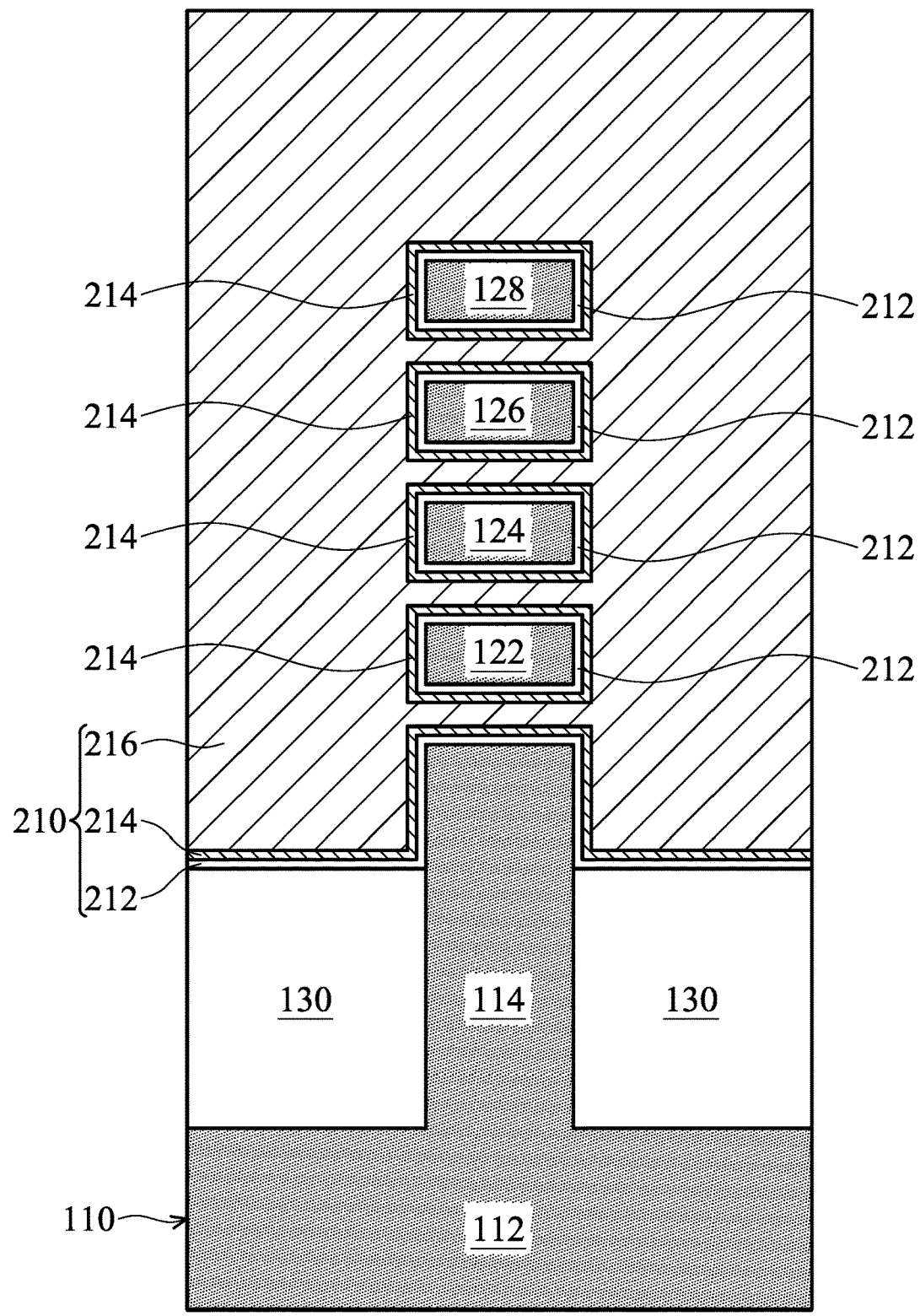
FIG. 5A is a cross-sectional view illustrating the semiconductor device structure along a sectional line I-I' in FIG. 4C, in accordance with some embodiments.
Figure 5B:
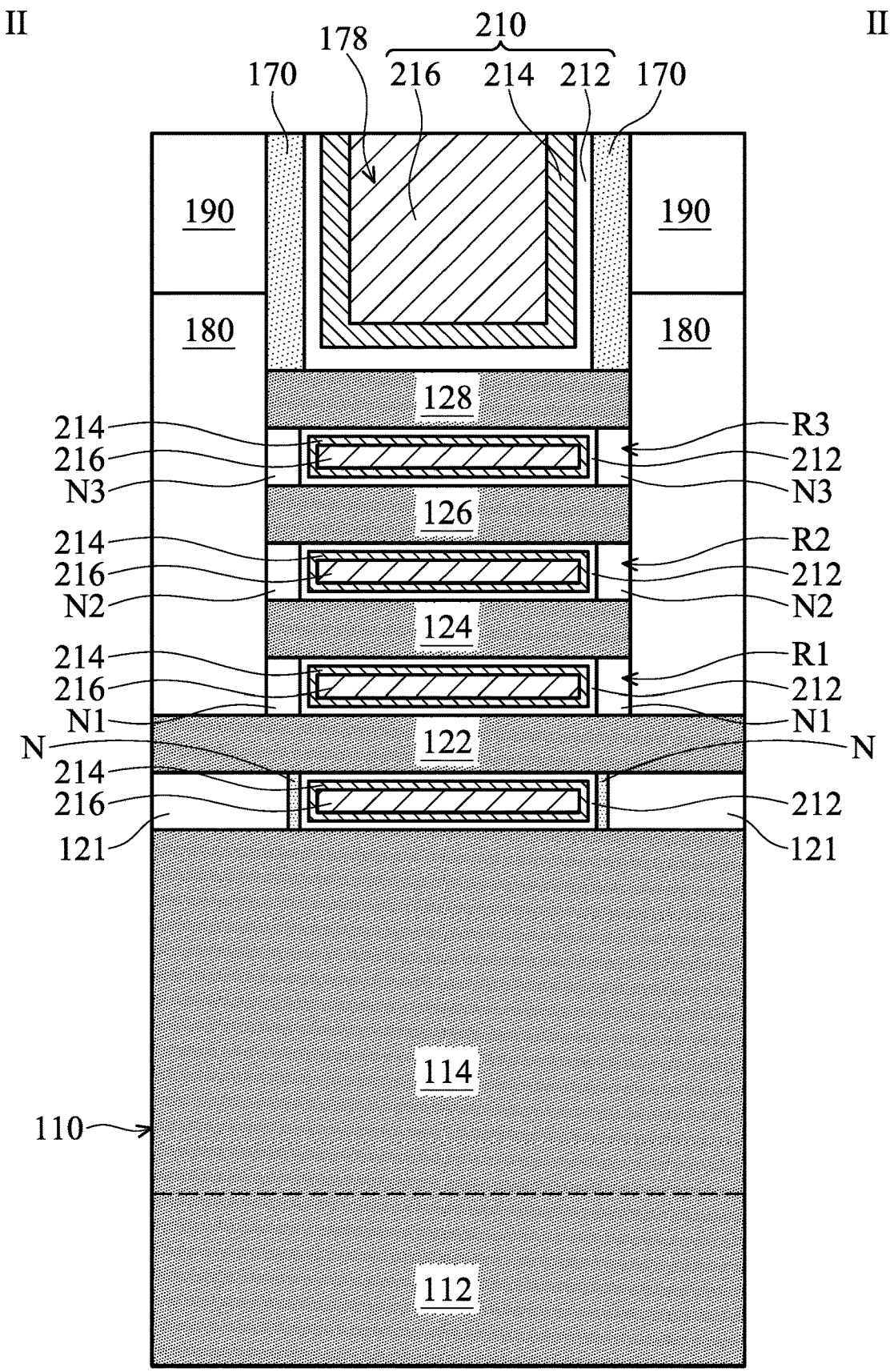
FIG. 5B is a cross-sectional view illustrating the semiconductor device structure along a sectional line II-II' in FIG. 4C, in accordance with some embodiments.
Figure 6A:
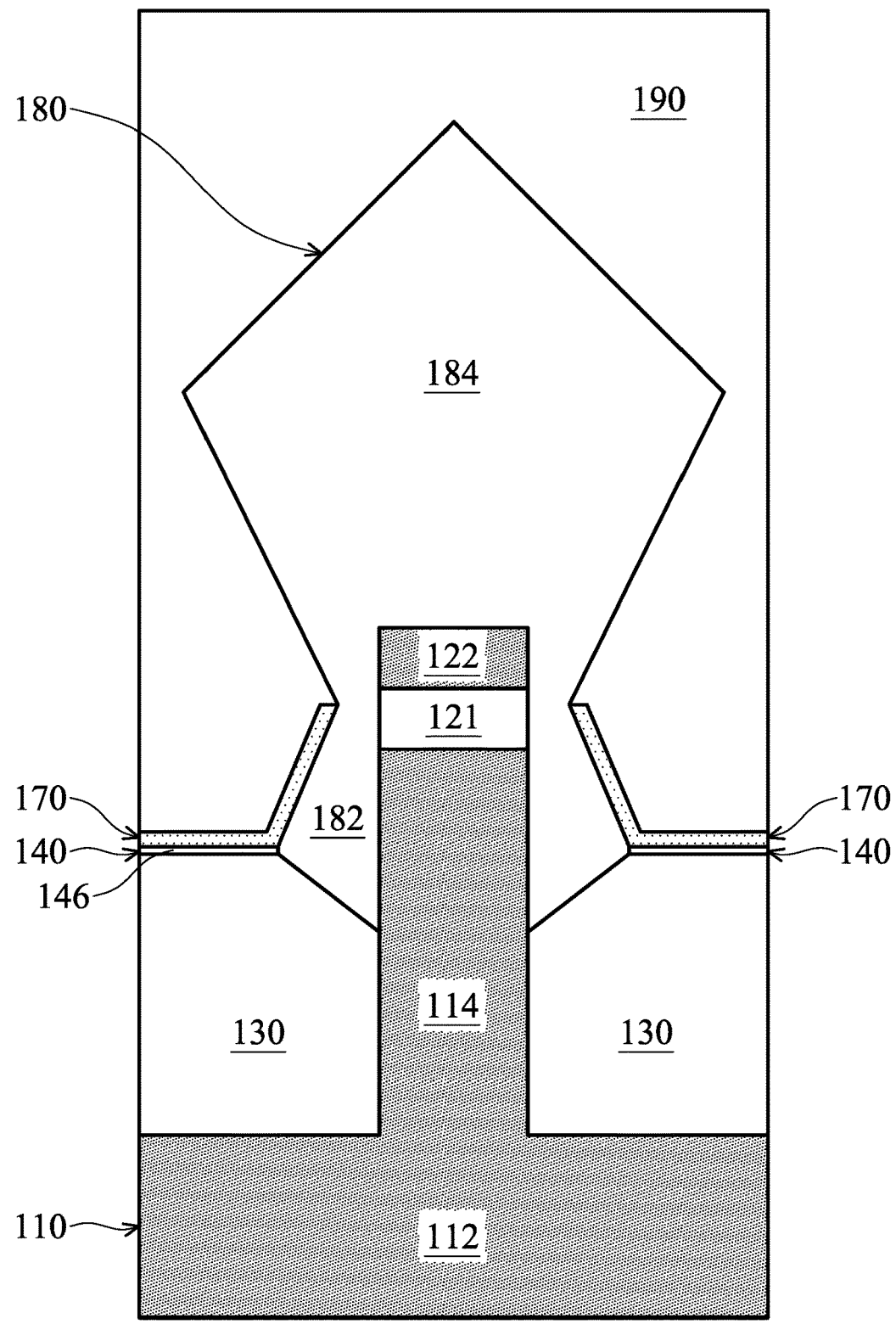
FIGS. 6A-6B are cross-sectional views of various stages of a process for forming a semiconductor device structure, in accordance with some embodiments.

FIG. 5A is a cross-sectional view illustrating the semiconductor device structure along a sectional line I-I' in FIG. 4C, in accordance with some embodiments. FIG. 5B is a cross-sectional view illustrating the semiconductor device structure along a sectional line II-II' in FIG. 4C, in accordance with some embodiments. FIG. 6A is a cross-sectional view illustrating the semiconductor device structure along a sectional line III-III' in FIG. 4C, in accordance with some embodiments.

In some embodiments, a dielectric material layer (not shown) is formed over the source/drain structures 180 and the spacer layer 170 of FIG. 4B, in accordance with some embodiments. As shown in FIG. 4C, the mask layer 160 and upper portions of the spacer layer 170 and the dielectric material layer are removed, in accordance with some embodiments. The remaining dielectric material layer forms a dielectric layer 190, in accordance with some embodiments.

As shown in FIGS. 4C, 5B, and 6A, the dielectric layer 190 is over the source/drain structures 180 and the spacer layer 170, in accordance with some embodiments. The dielectric layer 190 includes an oxide-containing material such as silicon oxide, in accordance with some embodiments. The removal process includes a planarization process, such as a chemical mechanical polishing process, in accordance with some embodiments.

As shown in FIG. 4C, the gate electrode layer 150 and the part P1 of the gate dielectric layer 140 are removed to form a trench 173 in the spacer layer 170, in accordance with some embodiments. The trench 178 exposes the nanostructure stack 120, in accordance with some embodiments.

As shown in FIGS. 4C and 5B, the nanostructures 121, 123, 125 and 127 exposed by the trench 178 are removed, in accordance with some embodiments. As shown in FIGS. 4C, 5A, and 5B, a gate structure 210 is formed in the trench 178, in accordance with some embodiments.

The gate structure 210 wraps around the nanostructures 122, 124, 126, and 128 and an upper portion of the fin 114, in accordance with some embodiments. The gate structure 210 includes a gate dielectric layer 212, a work function metal layer 214, and a gate electrode layer 216, in accordance with some embodiments.

The gate dielectric layer 212 conformally covers inner walls and a bottom surface of the trench 178, in accordance with some embodiments. The work function metal layer 214 is conformally formed over the gate dielectric layer 212, in accordance with some embodiments. The gate electrode layer 216 is formed over the work function metal layer 214, in accordance with some embodiments.

Figure 6B:
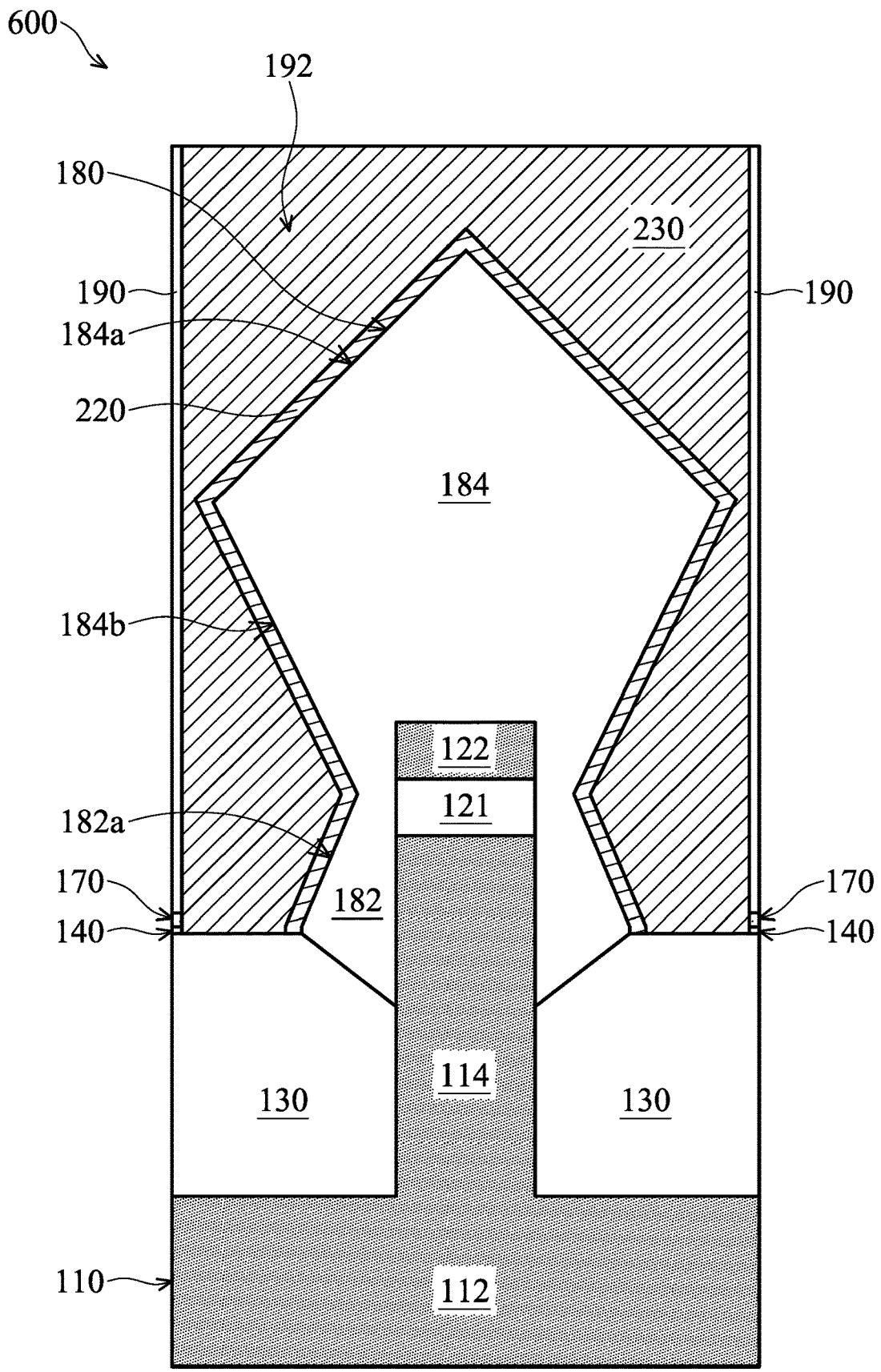

FIGS. 6A-6B are cross-sectional views of various stages of a process for forming a semiconductor device structure, in accordance with some embodiments. As shown in FIG. 6B, the dielectric layer 190, the spacer layer 170 and the gate dielectric layer 140 adjacent to the source/drain structures 180 are removed to form contact holes 192, in accordance with some embodiments.

The contact holes 192 pass through the dielectric layer 190, the spacer layer 170, and the gate dielectric layer 140, in accordance with some embodiments. The contact holes 192 expose the source/drain structures 180, in accordance with some embodiments.

As shown in FIG. 6B, a silicide layer 220 is formed over the source/drain structures 180, in accordance with some embodiments. The silicide layer 220 conformally covers the source/drain structures 180, in accordance with some embodiments. The silicide layer 220 covers an entire exterior surface of each source/drain structure 180, such as the upper surfaces 182a and 184a and the lower surfaces 184b, in accordance with some embodiments.

As shown in FIG. 6B, contact structures 230 are formed in the contact holes 192, in accordance with some embodiments. The contact structures 230 are in direct contact with the silicide layer 220, in accordance with some embodiments. The contact structures 230 pass through the dielectric layer 190, the spacer layer 170, and the gate dielectric layer 140, in accordance with some embodiments.

Each contact structure 230 wraps around the silicide layer 220 and the corresponding source/drain structure 180, in accordance with some embodiments. Each contact structure 230 wraps around the upper portion 184, the neck portion 186, and the lower portion 132 of the corresponding source/drain structure 180, in accordance with some embodiments. In this step, a semiconductor device structure 600 is substantially formed, in accordance with some embodiments.

Figure 7A:
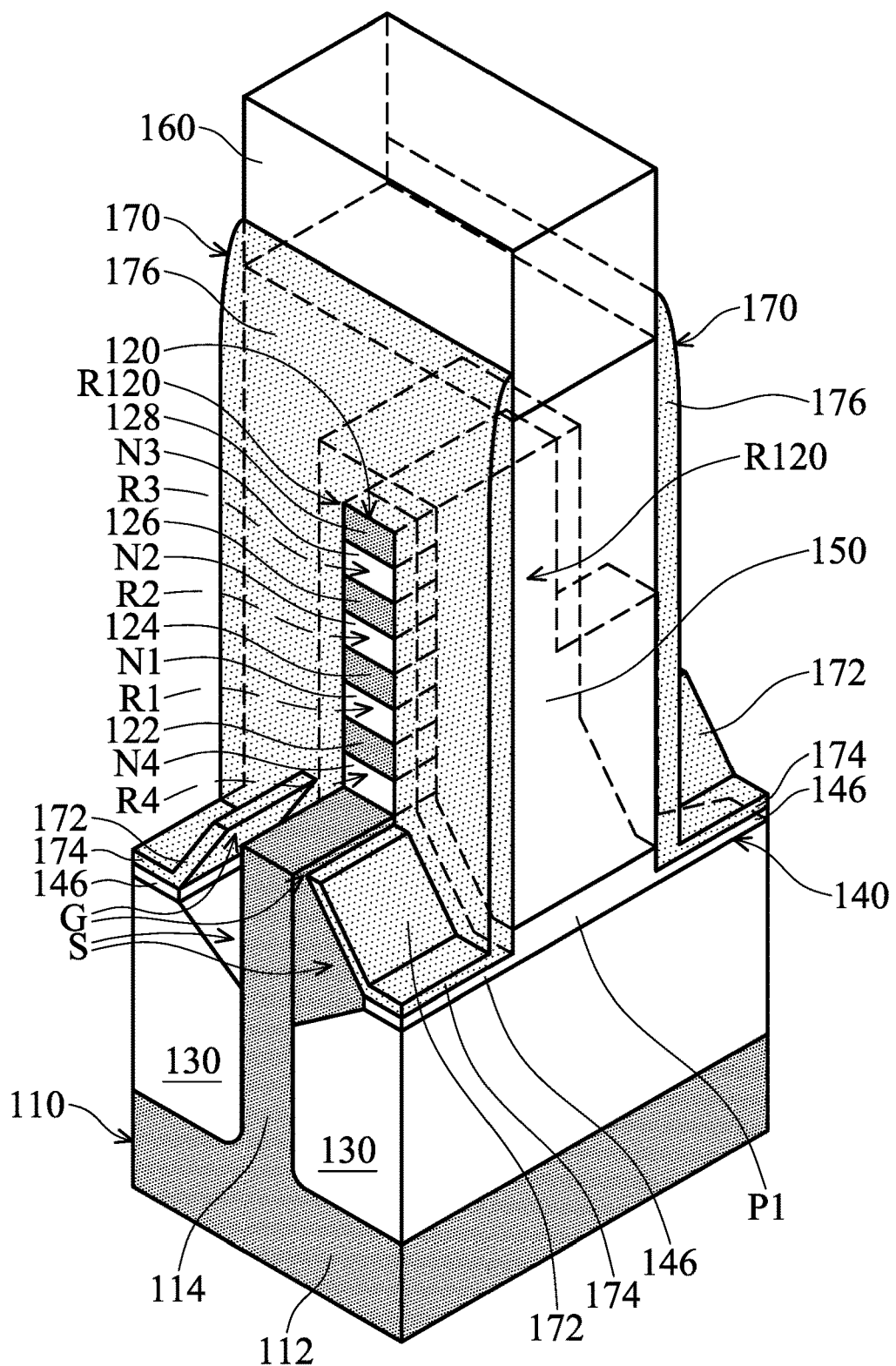
FIGS. 7A-7C are perspective views of various stages of a process for forming a semiconductor device structure, in accordance with some embodiments.
Figure 7B:
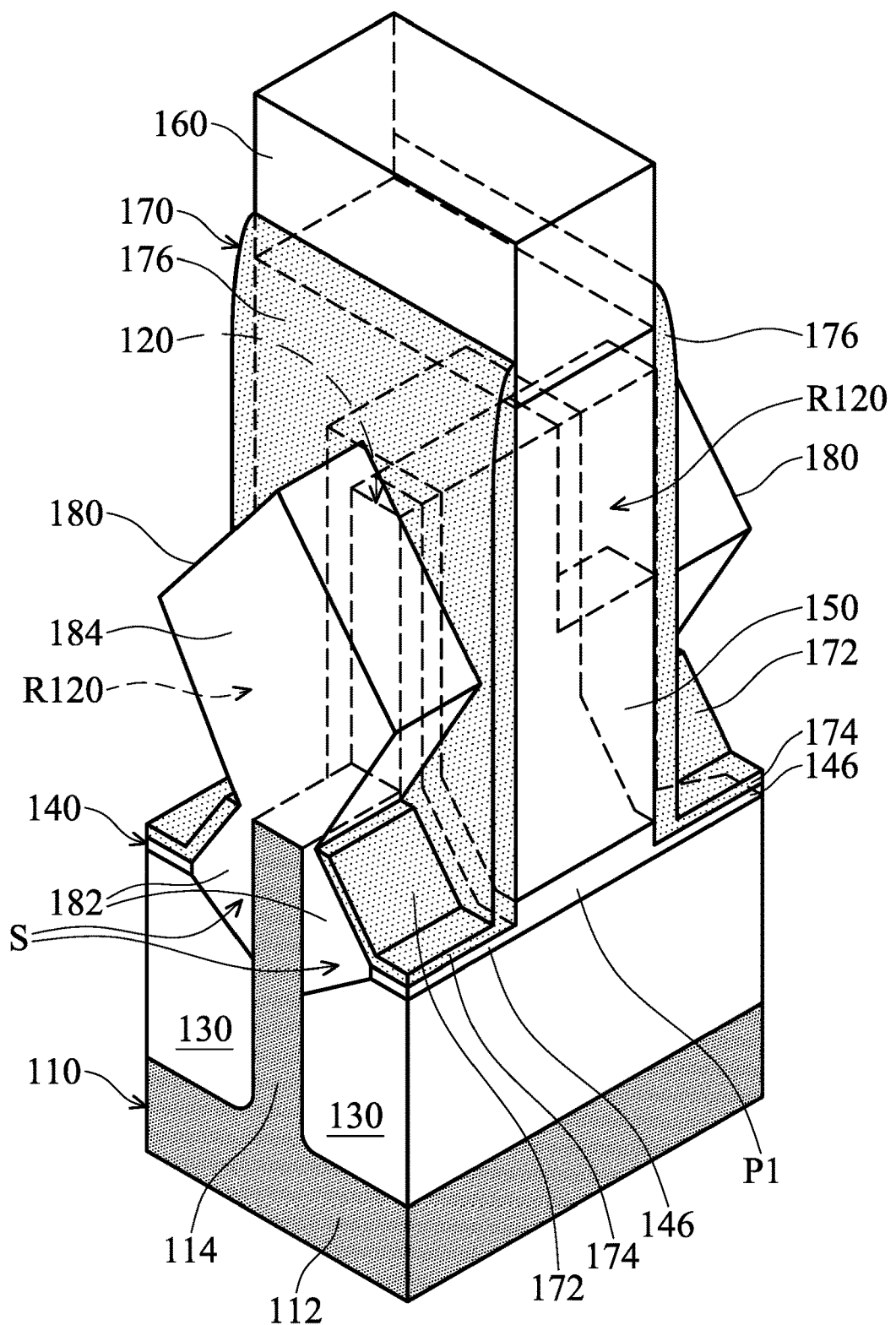
Figure 7C:
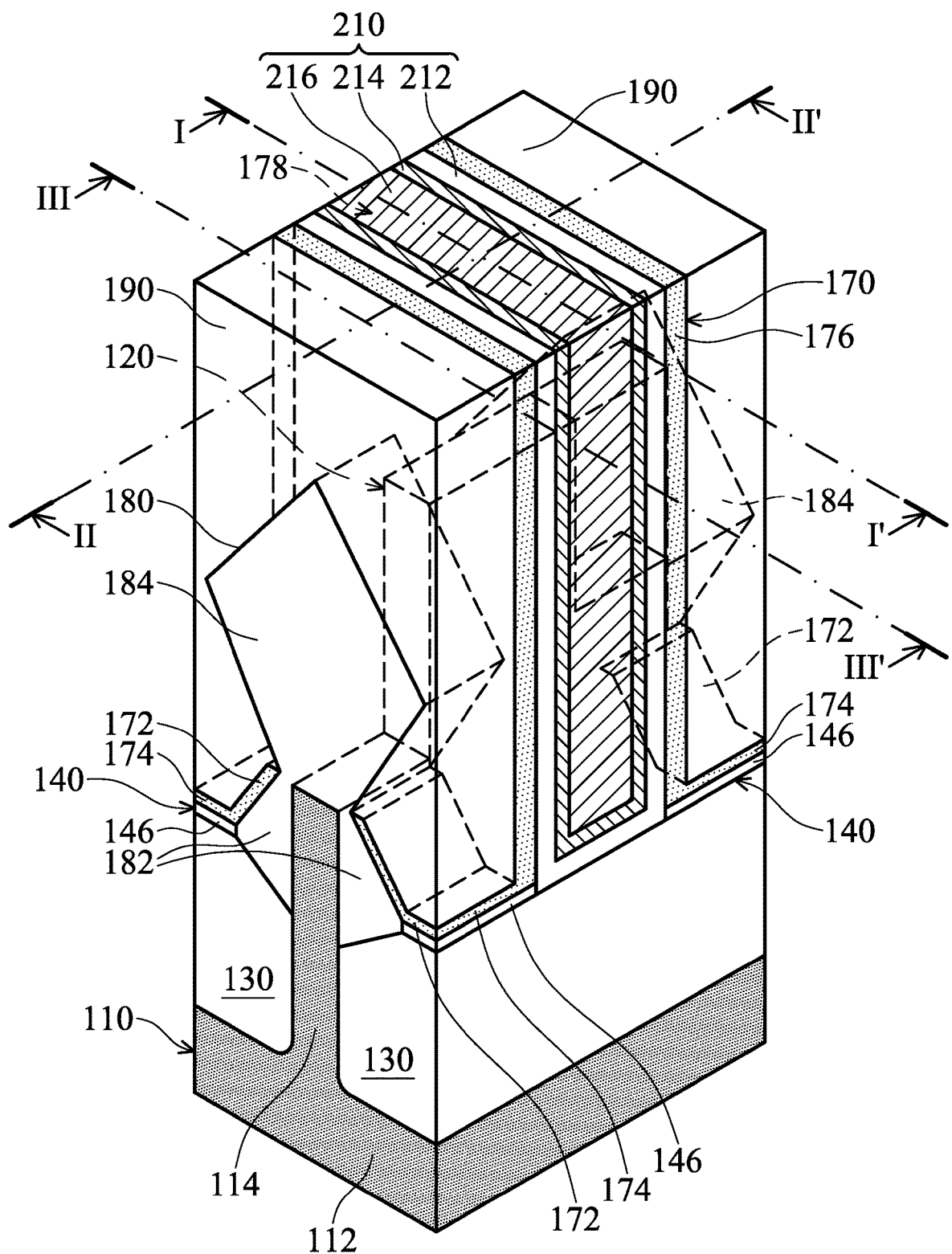

FIGS. 7A-7C are perspective views of various stages of a process for forming a semiconductor device structure, in accordance with some embodiments. As shown in FIG. 7A, after the step of FIG. 1E, the upper portion 142 of the gate dielectric layer 140, end portions of the nanostructures 121, 122, 123, 124, 125, 126, 127, and 128, which are not covered by the spacer layer 170 and the gate electrode layer 150, the lower portion 144 of the gate dielectric layer 140, and a portion of the isolation layer 130 under the lower portion 144, are removed, in accordance with some embodiments. The removal process forms recesses R120 in the nanostructure stack 120 and on two opposite sides of the gate electrode layer 150, in accordance with some embodiments.

The removal process includes etching processes, such as a dry etching process and a chemical etching process, in accordance with some embodiments. The dry etching process includes an anisotropic etching process, such as a plasma etching process, in accordance with some embodiments. The chemical etching process includes an isotropic etching process, such as a wet etching process or a gas-phase etching process, in accordance with some embodiments.

Specifically, as shown in FIGS. 1E and 7A, the upper portion 142 of the gate dielectric layer 140 and the end portions of the nanostructures 121, 122, 123, 124, 125, 126, 127, and 128, which are not covered by the spacer layer 170 and the gate electrode layer 150, are removed using a dry etching process. The lower portion 144 of the gate dielectric layer 140 and the portion of the isolation layer 130 thereunder are removed using the chemical etching process, in accordance with some embodiments.

Since the etching selectivity (between the gate dielectric layer 140 and the nanostructure stack 120) of the dry etching process of FIG. 7B is less than that of FIG. 4A, the dry etching process of FIG. 7B removes more nanostructures than that of FIG. 4A, in accordance with some embodiments.

As shown in FIG. 7A, the nanostructures 121, 123, 125, and 127 under the spacer layer 170 are removed to form recesses R4, R1, R2, and R3 in the nanostructure stack 120, in accordance with some embodiments. The recess R4 is between the fin 114 and the nanostructure 122, in accordance with some embodiments.

The recess R1 is between the nanostructures 122 and 124, in accordance with some embodiments. The recess R2 is between the nanostructures 124 and 126, in accordance with some embodiments. The recess R3 is between the nanostructures 126 and 128, in accordance with some embodiments.

As shown in FIG. 7A, inner spacers N1, N2, N3, and N4 are respectively formed in the recesses R1, R2, R3, and R4, in accordance with some embodiments. In some embodiments, the inner spacers N1, N2, N3, and N4 are made of an oxide-containing insulating material, such as silicon oxide.

In some other embodiments, the inner spacers N1, N2, N3, and N4 are made of a nitride-containing insulating material, such as silicon nitride (SiN), silicon oxynitride (SiON), silicon oxycarbonitride (SiOCN), or silicon carbonitride (SiCN). The inner spacers N1, N2, N3, and N4 are formed using a deposition process, such as a chemical vapor deposition process or a physical vapor deposition process, and an etching process, in accordance with some embodiments.

As shown in FIG. 7B, source/drain structures 180 are formed in the spaces S and the recesses R120 of the nanostructure stack 120, in accordance with some embodiments. The source/drain structures 180 are in direct contact with the fin 114 and the nanostructure stack 120, in accordance with some embodiments. The fin 114 passes through the source/drain structures 180, in accordance with some embodiments.

Figure 8A:
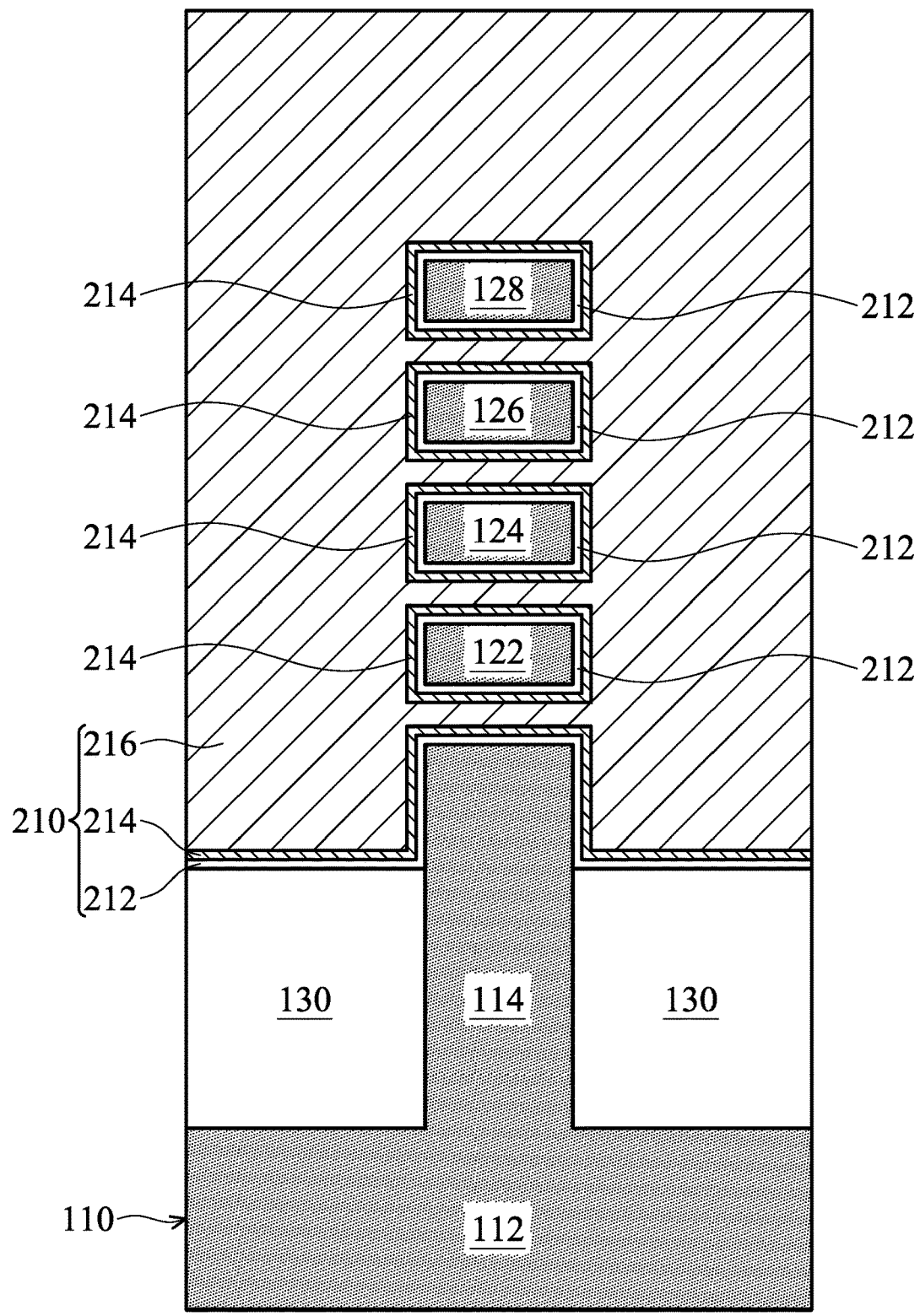
FIG. 8A is a cross-sectional view illustrating the semiconductor device structure along a sectional line I-I' in FIG. 7C, in accordance with some embodiments.
Figure 8B:
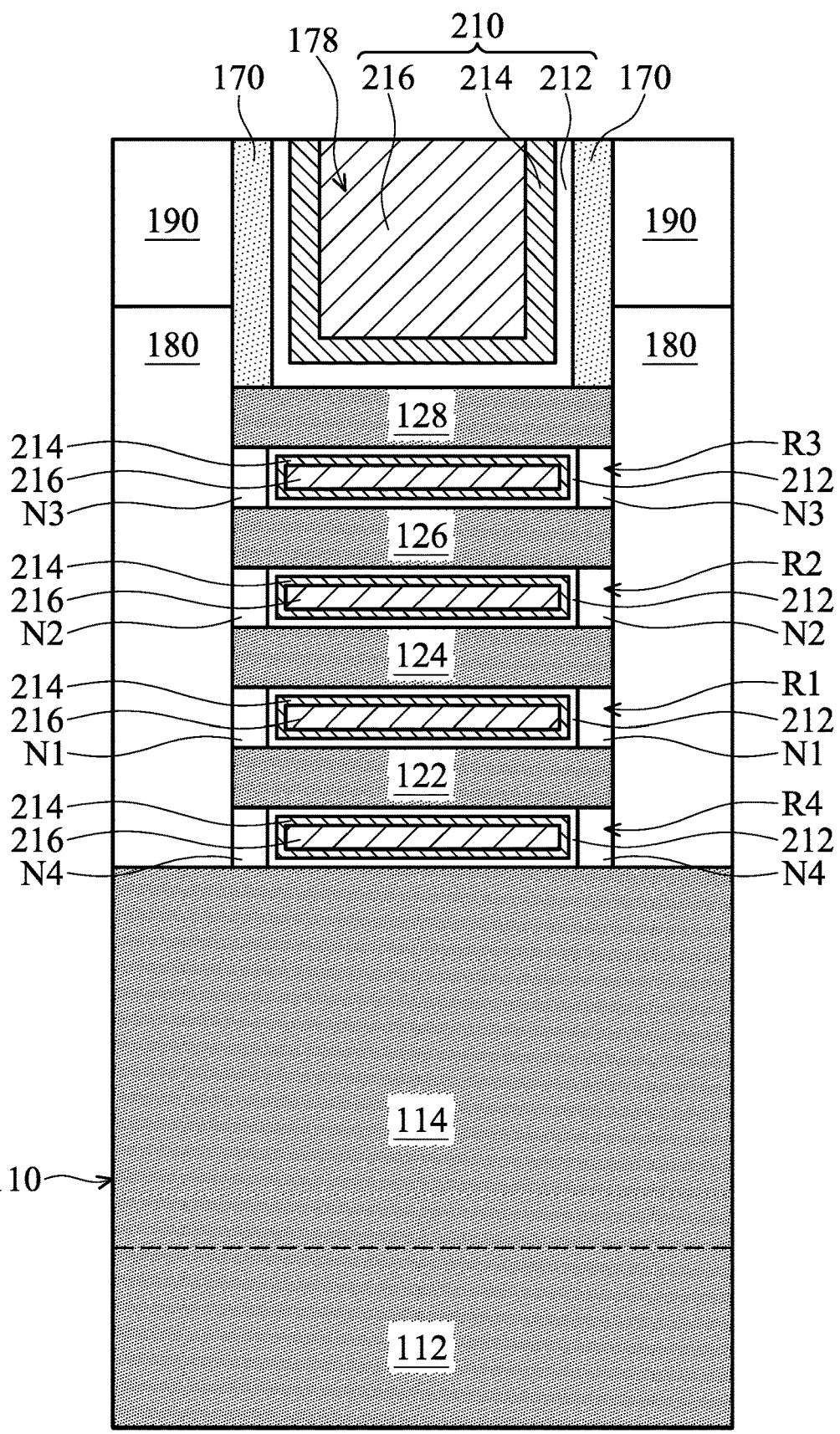
FIG. 8B is a cross-sectional view illustrating the semiconductor device structure along a sectional line II-II' in FIG. 7C, in accordance with some embodiments.
Figure 9A:
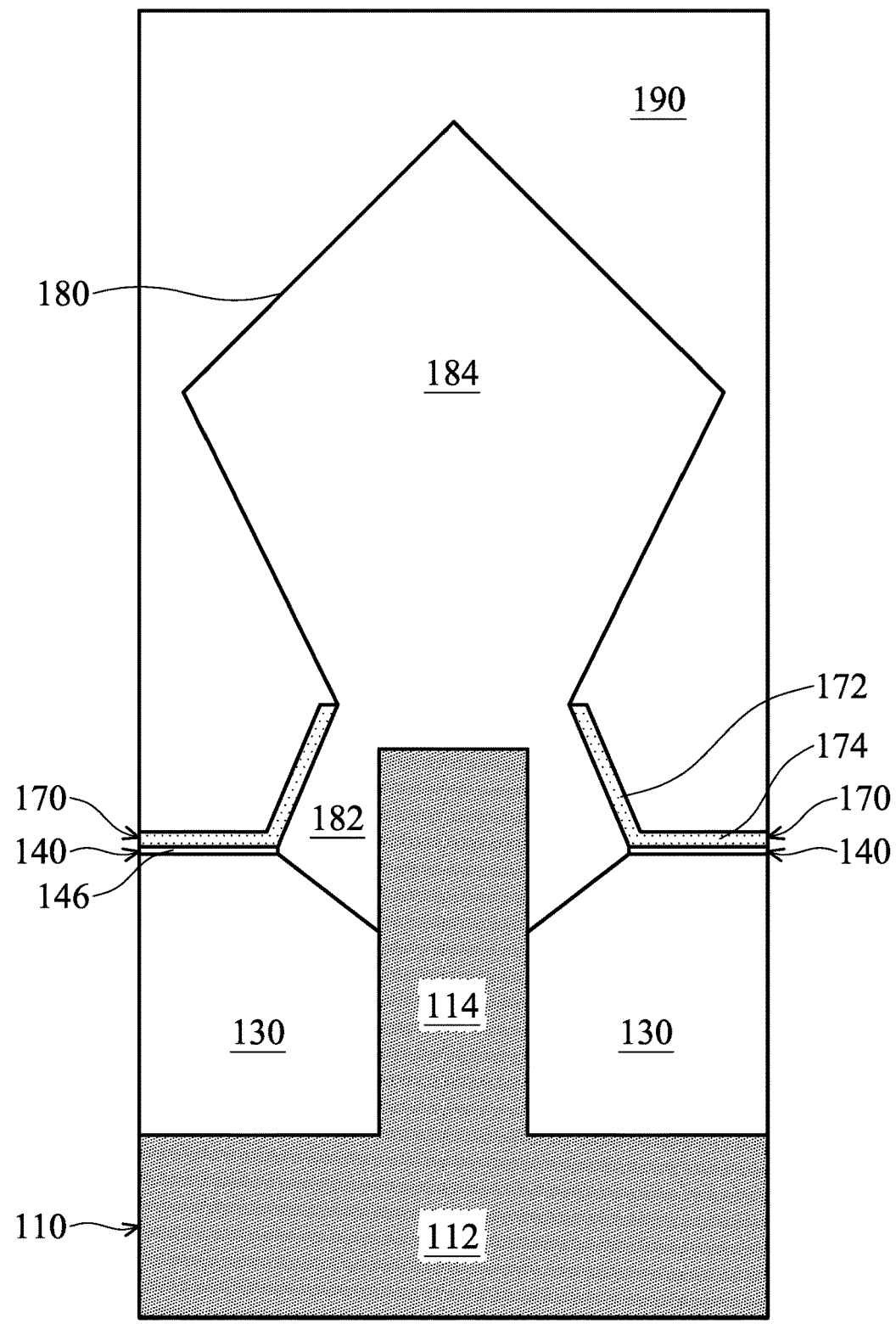
FIGS. 9A-9B are cross-sectional views of various stages of a process for forming a semiconductor device structure, in accordance with some embodiments.

FIG. 8A is a cross-sectional view illustrating the semiconductor device structure along a sectional line I-I' in FIG. 7C, FIG. 8B is a cross-sectional view illustrating the semiconductor device structure along a sectional line II-II' in FIG. 7C, and FIG. 9A is a cross-sectional view illustrating the semiconductor device structure along a sectional line III-III' in FIG. 7C, in accordance with some embodiments.

In some embodiments, a dielectric material layer (not shown) is formed over the source/drain structures 180 and the spacer layer 170 of FIG. 7B, in accordance with some embodiments. As shown in FIG. 7C, the mask layer 160 and upper portions of the spacer layer 170 and the dielectric material layer are removed, in accordance with some embodiments. The remaining dielectric material layer forms a dielectric layer 190, in accordance with some embodiments.

As shown in FIGS. 7C, 8B, and 9A, the dielectric layer 190 is over the source/drain structures 180 and the spacer layer 170, in accordance with some embodiments. The dielectric layer 190 includes an oxide-containing material such as silicon oxide, in accordance with some embodiments. The removal process includes a planarization process, such as a chemical mechanical polishing process, in accordance with some embodiments.

As shown in FIG. 7C, the gate electrode layer 150 and the part P1 of the gate dielectric layer 140 are removed to form a trench 178 in the spacer layer 170, in accordance with some embodiments. The trench 178 exposes the nanostructure stack 120, in accordance with some embodiments.

As shown in FIGS. 7C and 8B, the nanostructures 121, 123, 125 and 127 exposed by the trench 178 are removed, in accordance with some embodiments. As shown in FIGS. 7C, 8A, and 8B, a gate structure 210 is formed in the trench 178, in accordance with some embodiments.

The gate structure 210 wraps around the nanostructures 122, 124, 126, and 128 and an upper portion of the fin 114, in accordance with some embodiments. The gate structure 210 includes a gate dielectric layer 212, a work function metal layer 214, and a gate electrode layer 216, in accordance with some embodiments.

The gate dielectric layer 212 conformally covers inner walls and a bottom surface of the trench 178, in accordance with some embodiments. The work function metal layer 214 is conformally formed over the gate dielectric layer 212, in accordance with some embodiments. The gate electrode layer 216 is formed over the work function metal layer 214, in accordance with some embodiments.

Figure 9B:
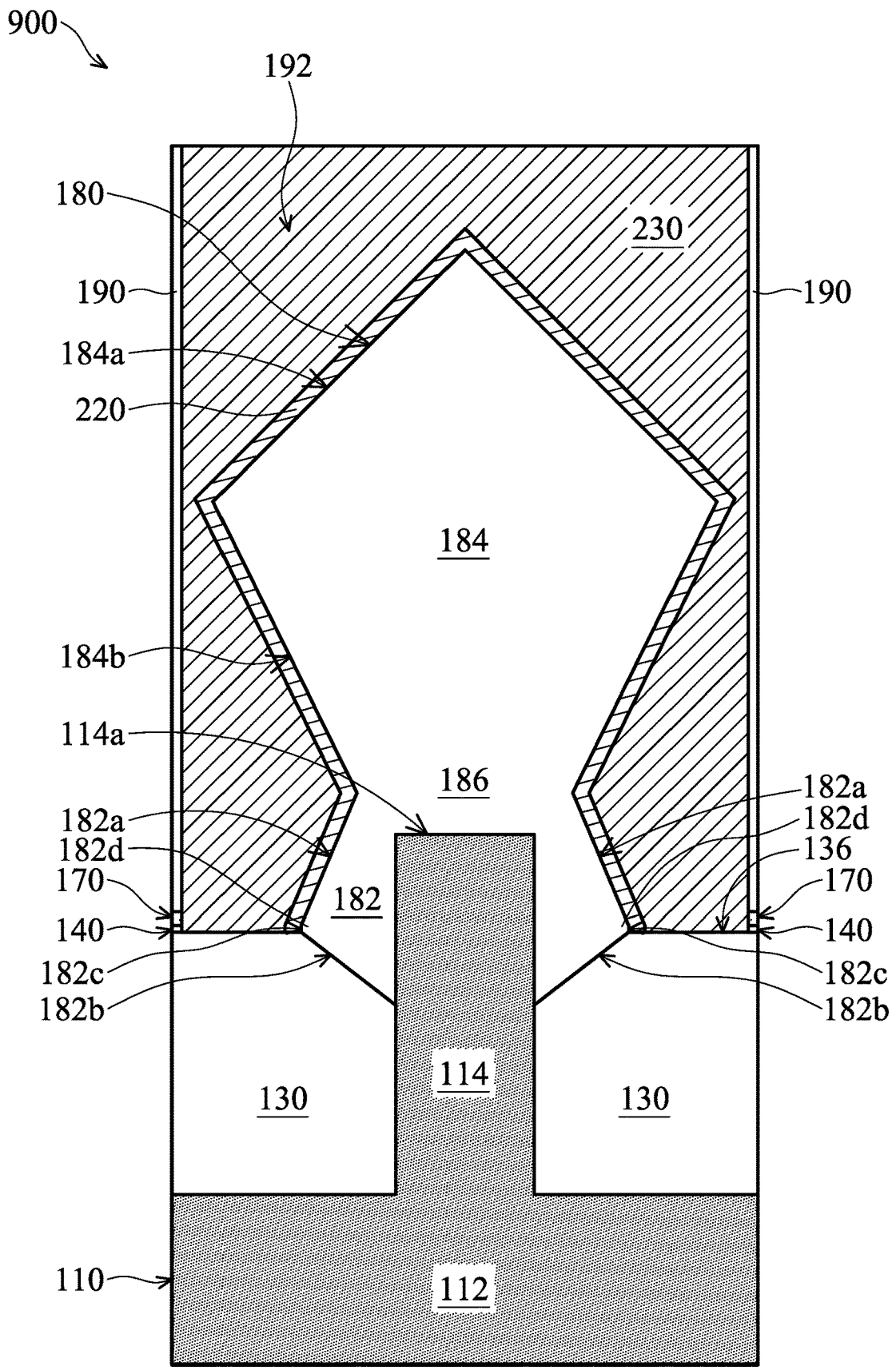

FIGS. 9A-9B are cross-sectional views of various stages of a process for forming a semiconductor device structure, in accordance with some embodiments. As shown in FIG. 9B, the dielectric layer 190, the spacer layer 170 and the gate dielectric layer 140 adjacent to the source/drain structures 180 are removed to form contact holes 192, in accordance with some embodiments.

The contact holes 192 pass through the dielectric layer 190, the spacer layer 170, and the gate dielectric layer 140, in accordance with some embodiments. The contact holes 192 expose the source/drain structures 180, in accordance with some embodiments.

The lower portion 182 of the source/drain structure 180 has upper surfaces 182a, lower surfaces 182b, and facet surfaces 182c, in accordance with some embodiments. Each facet surface 182c is connected between the corresponding upper surface 182a and the corresponding lower surface 182b, in accordance with some embodiments. The lower portion 182 adjacent to the facet surfaces 182c has angular parts 182d, in accordance with some embodiments. The facet surfaces 182c or the angular parts 182d are substantially level with a top surface 136 of the isolation layer 130, in accordance with some embodiments.

As shown in FIG. 9B, a silicide layer 220 is formed over the source/drain structures 180, in accordance with some embodiments. The silicide layer 220 conformally covers the source/drain structures 180, in accordance with some embodiments. The silicide layer 220 covers an entire exterior surface of each source/drain structure 180, in accordance with some embodiments.

As shown in FIG. 9B, contact structures 230 are formed in the contact holes 192, in accordance with some embodiments. The contact structures 230 are in direct contact with the silicide layer 220, in accordance with some embodiments. The contact structures 230 pass through the dielectric layer 190, the spacer layer 170, and the gate dielectric layer 140, in accordance with some embodiments.

Each contact structure 230 wraps around the silicide layer 220 and the corresponding source/drain structure 180, in accordance with some embodiments. Each contact structure 230 wraps around the upper portion 184, the neck portion 186, and the lower portion 182 of the corresponding source/drain structure 180, in accordance with some embodiments. In this step, a semiconductor device structure 900 is substantially formed, in accordance with some embodiments.

Figures 1, 9B:
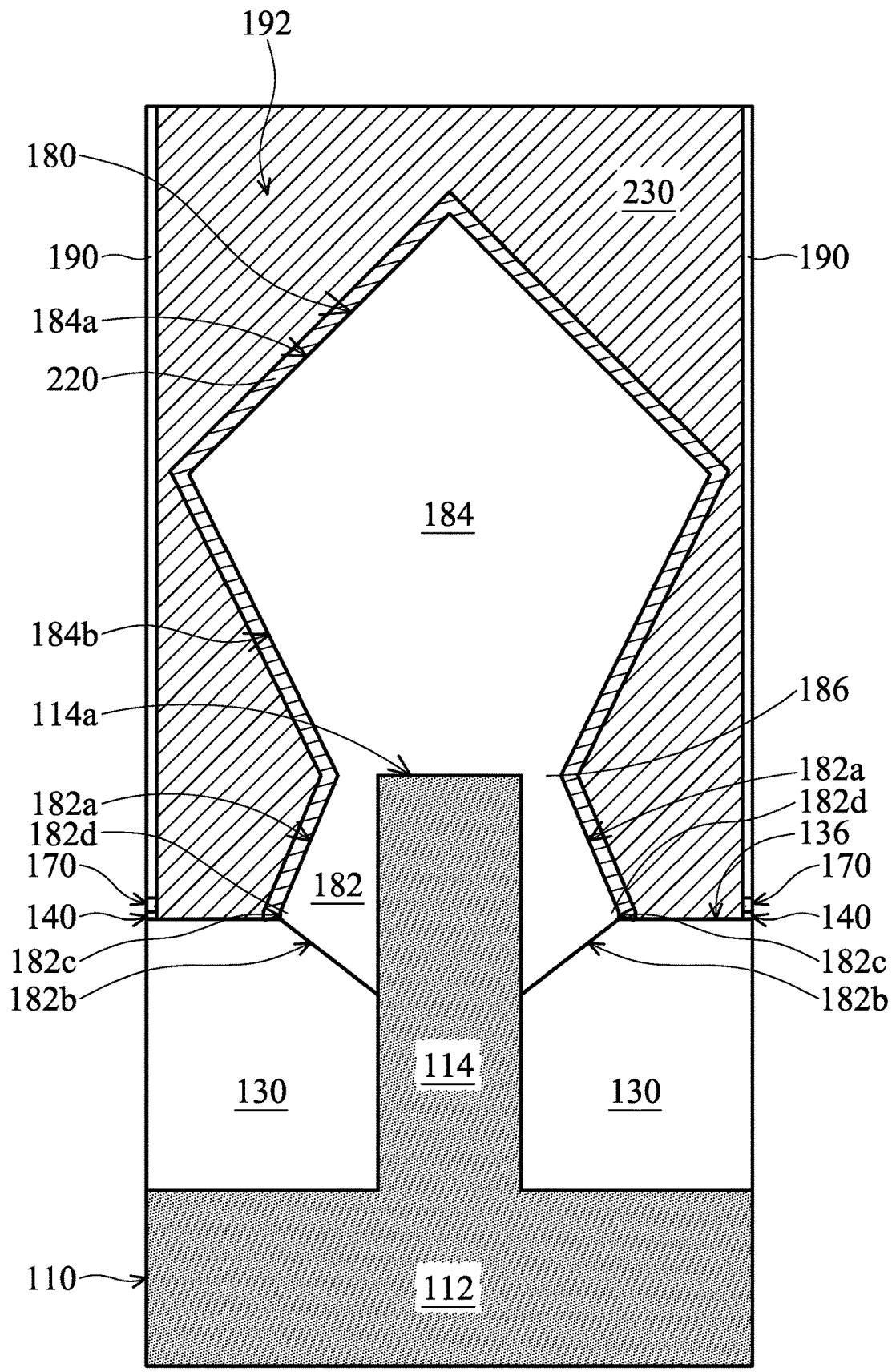
Figures 2, 9B:
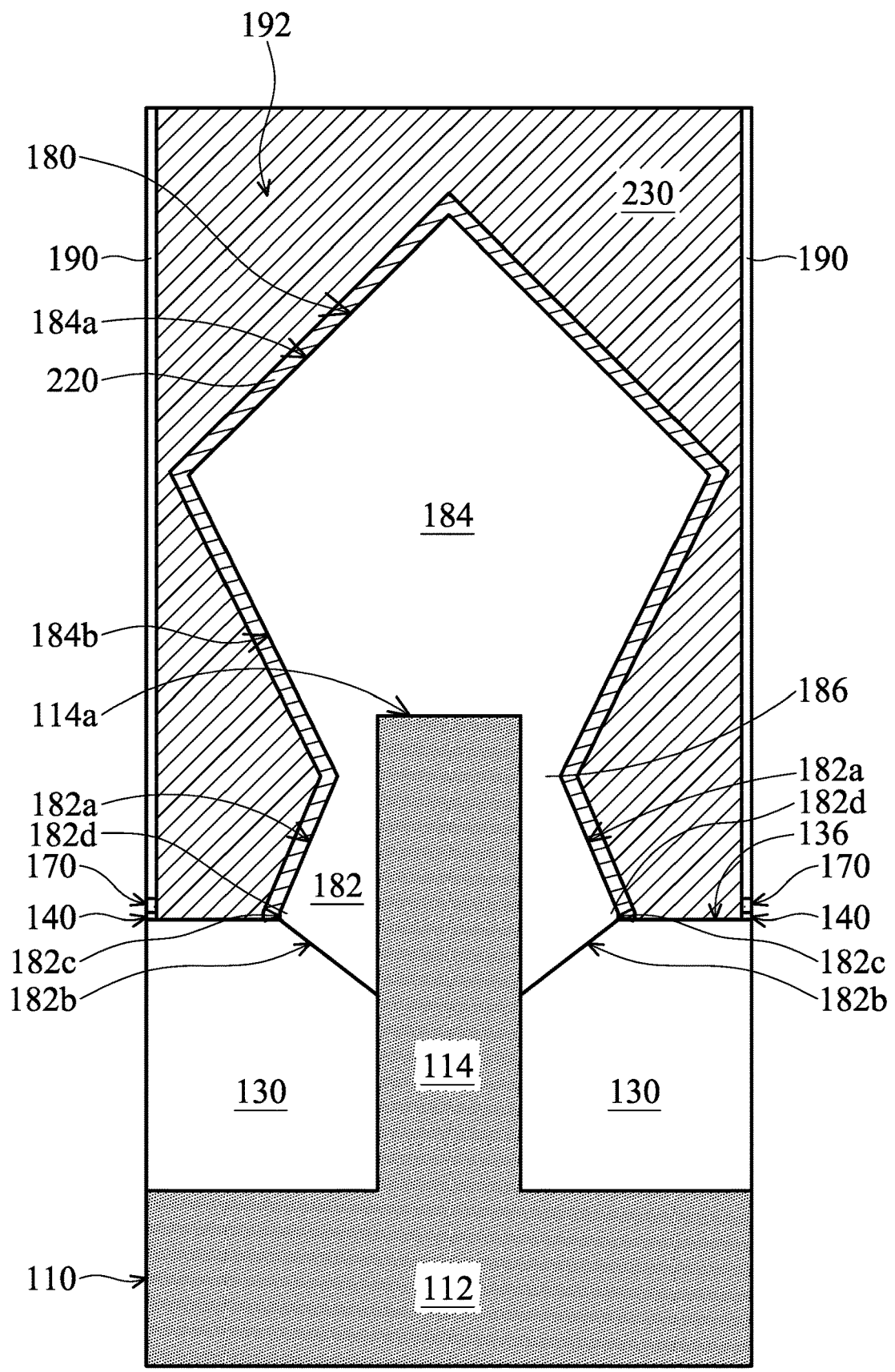

In some embodiments, a top surface 114a of the fin 114 is above the top surface 136 of the isolation layer 130. If the top surface 114a is below the top surface 136, the surface area of the fin 114 for epitaxial growth is too small and therefore the epitaxial time for growing the lower portion 182 is too long. As shown in FIG. 9B, the top surface 114a is under the neck portion 186 of the source/drain structures 180, in accordance with some embodiments. In some other embodiments, as shown in FIG. 9B-1, the top surface 114a is substantially level with the neck portion 186, in accordance with some embodiments. In still other embodiments, as shown in FIG. 9B-2, the top surface 114a is over the neck portion 186, in accordance with some embodiments.

Figure 10:
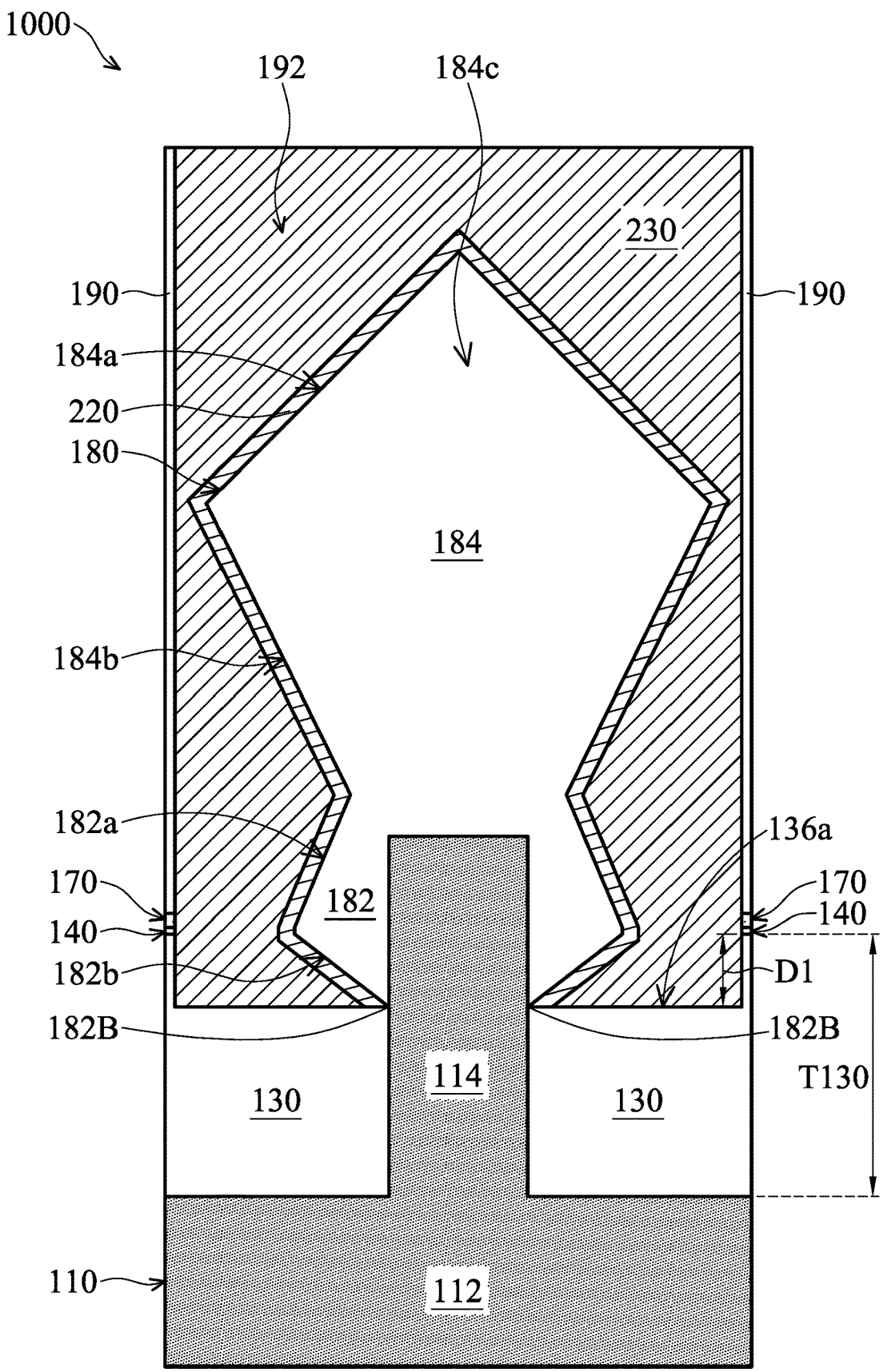
FIG. 10 is a cross-sectional view illustrating a semiconductor device structure, in accordance with some embodiments.

FIG. 10 is a cross-sectional view illustrating a semiconductor device structure 1000, in accordance with some embodiments. As shown in FIG. 10, the semiconductor device structure 1000 is similar to the semiconductor device structure 900 of FIG. 9B, except that the contact holes 192 of the semiconductor device structure 1000 further extend into the isolation layer 130, in accordance with some embodiments.

The contact hole 192 exposes an entire exterior surface of the corresponding source/drain structure 180, such as the upper surfaces 182a and the lower surfaces 182b of the lower portion 182 and the upper surfaces 184a and the lower surfaces 184b of the upper portion 184, in accordance with some embodiments. The upper surface 136a of the isolation layer 130 is substantially level with a bottom 182B of the lower portion 182, in accordance with some embodiments. The silicide layer 220 is formed over the entire exterior surface of each source/drain structure 180, in accordance with some embodiments.

The contact hole 192 extends into the isolation layer 130 a distance D1, in accordance with some embodiments. In some embodiments, a ratio of the distance D1 to a thickness T130 of the isolation layer 130 ranges from about 0.05 to about 0.4. If the ratio is greater than 0.4, the isolation layer 130 may be too thin to electrically insulate the contact structure 230 thereover from the base 112 thereunder, which may cause short circuit between the adjacent contact structure 230.

Figure 11:
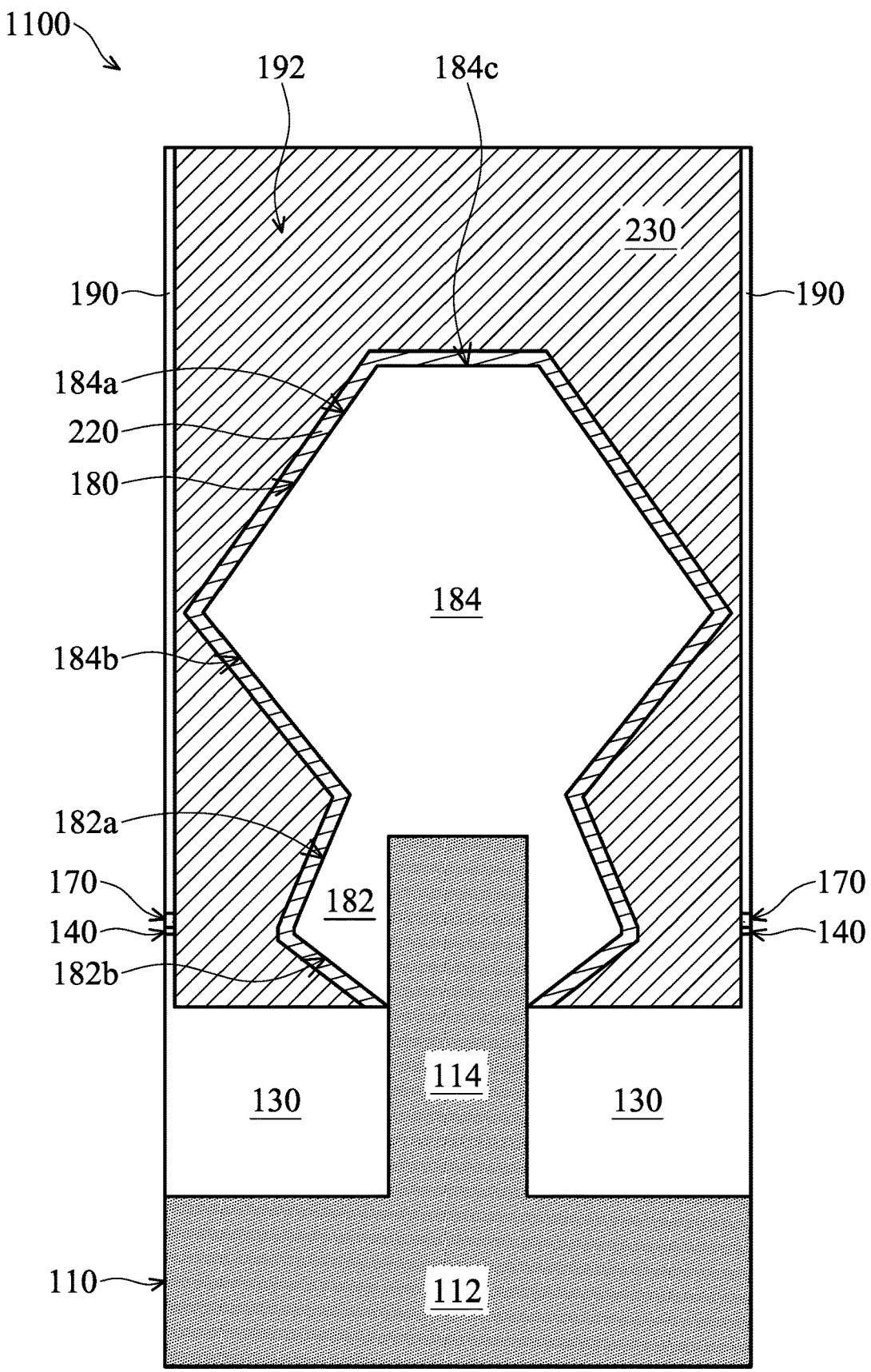
FIG. 11 is a cross-sectional view illustrating a semiconductor device structure, in accordance with some embodiments.

FIG. 11 is a cross-sectional view illustrating a semiconductor device structure 1100, in accordance with some embodiments. As shown in FIG. 11, the semiconductor device structure 1100 is similar to the semiconductor device structure 1000 of FIG. 10, except that the upper portion 184 of each source/drain structure 180 has a flat top surface 184c, in accordance with some embodiments. The flat top surface 184c is formed during forming the contact hole 192, in accordance with some embodiments. That is, the sharp top portion of the upper portion 184 is removed during forming the contact hole 192, in accordance with some embodiments. The contact holes 192 and the flat top surface 184c are formed using a dry etching process, such as an anisotropic etching process (e.g., a plasma etching process), in accordance with some embodiments.

Figure 12:
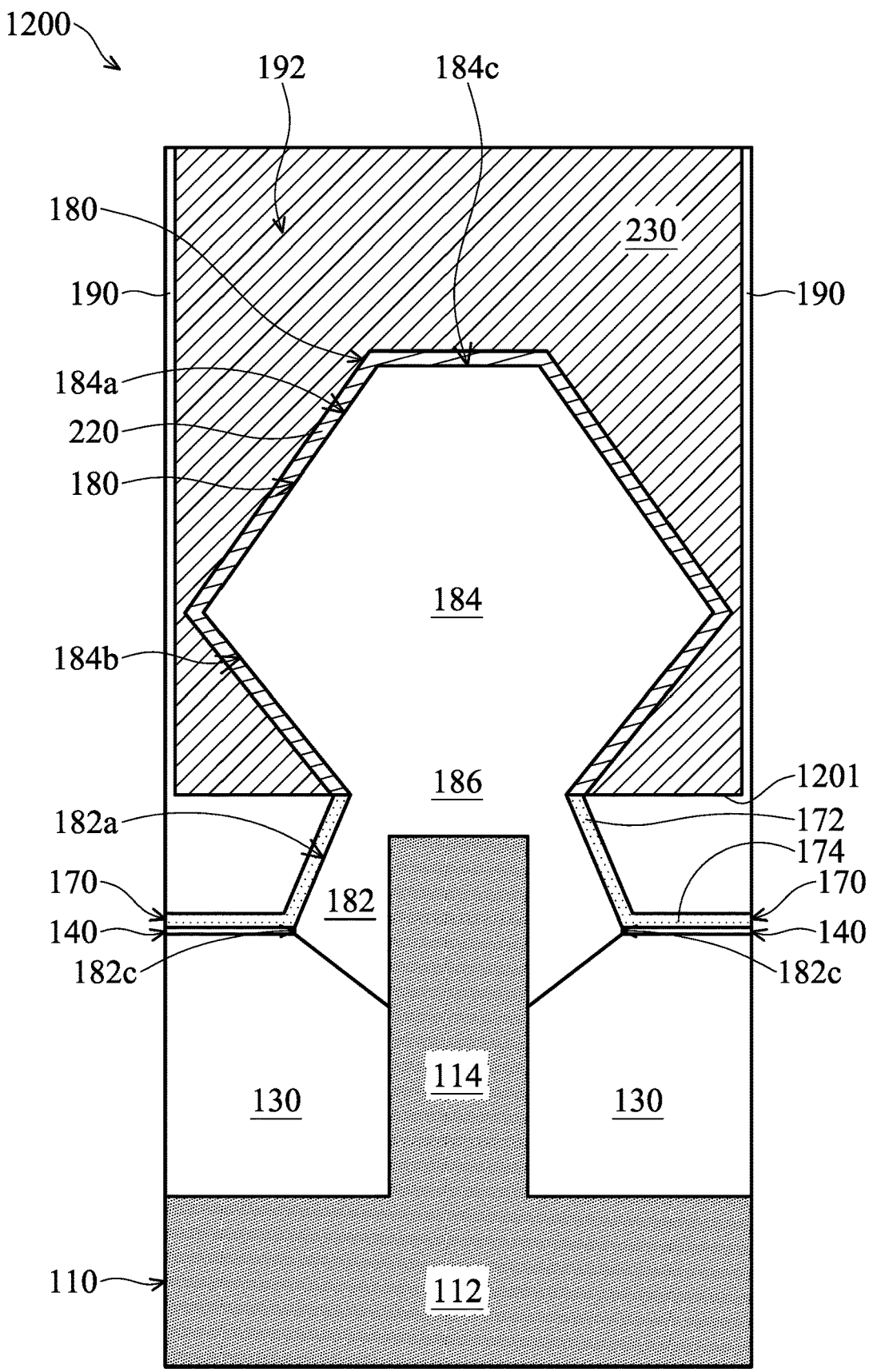
FIG. 12 is a cross-sectional view illustrating a semiconductor device structure, in accordance with some embodiments.

FIG. 12 is a cross-sectional view illustrating a semiconductor device structure 1200, in accordance with some embodiments. As shown in FIG. 12, the semiconductor device structure 1200 is similar to the semiconductor device structure 1100 of FIG. 11, except that the contact hole 192 exposes the upper portion 184 of the corresponding source/drain structure 180 and does not expose the lower portion 182 of the corresponding source/drain structure 180, in accordance with some embodiments.

As a result, the silicide layer 220 covers the upper portion 184 and does not cover the lower portion 132, in accordance with some embodiments. The contact structure 230 wraps around the corresponding upper portion 134, in accordance with some embodiments. The contact structures 230 do not pass through the dielectric layer 190, spacer layer 170, and the gate dielectric layer 140, in accordance with some embodiments.

The dielectric layer 190 under the contact structure 230 surrounds the lower portion 182, in accordance with some embodiments. The lower boundary surface 1201 between the contact structure 230 and the dielectric layer 190 is higher than, lower than, or substantially level with the neck portion 186 of the source/drain structure 180, in accordance with some embodiments.

The sloped portion 172 of the spacer layer 170 conformally covers the upper surfaces 182a of the lower portion 132, in accordance with some embodiments. The sloped portion 172 is in direct contact with the upper surfaces 182a, in accordance with some embodiments. The gate dielectric layer 140 is in direct contact with the facet surfaces 182c of the lower portion 182, in accordance with some embodiments.

Processes and materials for forming the semiconductor device structures 1000, 1100 and 1200 may be similar to, or the same as, those for forming the semiconductor structures 300, 600 and 900 described above.

In accordance with some embodiments, semiconductor device structures and methods for forming the same are provided. The methods (for forming the semiconductor device structure) includes forming a sloped spacer layer in a source/drain region and on opposite sides of a fin; removing structures under the sloped spacer layer to form spaces between the fin and the sloped spacer layer; and forming a source/drain structure in the space and over the space and having a double-diamond-like shape. The formation of the sloped spacer layer is able to constrain the maximum width of the source/drain structure to prevent adjacent two source/drain structures from short circuit. Since the source/drain structure with the double-diamond-like shape has a greater surface area than a source/drain structure with a single-diamond-like shape, the formation of the sloped spacer layer is able to increase the surface area of the source/drain structure. Therefore, the contact area between a silicide layer and the source/drain structure and the contact area between the silicide layer and a contact structure are both increased. As a result, the resistance between the contact structure and the source/drain structure is reduced, which improves the performance of the semiconductor device structure.

In accordance with some embodiments, a semiconductor device structure is provided. The semiconductor device structure includes a substrate having a base and a fin over the base. The semiconductor device structure includes a gate structure wrapping around a top portion of the fin. The semiconductor device structure includes a first nanostructure over the fin and passing through the gate structure. The semiconductor device structure includes a source/drain structure over the fin. The source/drain structure is over a side of the gate structure and connected to the first nanostructure, the source/drain structure has an upper portion, a lower portion, and a neck portion between the upper portion and the lower portion, the upper portion has a first diamond-like shape, and the lower portion is wider than the neck portion.

In accordance with some embodiments, a semiconductor device structure is provided. The semiconductor device structure includes a substrate having a base and a fin over the base. The semiconductor device structure includes a nanostructure over the fin. The semiconductor device structure includes a gate structure wrapping around the nanostructure and a top portion of the fin. The semiconductor device structure includes a spacer layer over a first sidewall of the gate structure and a second sidewall of the fin. The spacer layer has a sloped portion, the sloped portion is spaced apart from the fin by a distance, and the distance increases toward the base. The semiconductor device structure includes a source/drain structure over the fin. The source/drain structure is over a side of the gate structure and connected to the nanostructure, and the sloped portion covers a lower portion of the source/drain structure.

In accordance with some embodiments, a semiconductor device structure is provided. The semiconductor device structure includes a substrate having a base and a fin over the base. The semiconductor device structure includes a gate structure wrapping around a top portion of the fin. The semiconductor device structure includes a nanostructure over the fin and passing through the gate structure. The semiconductor device structure includes a source/drain structure over the fin. The source/drain structure is adjacent to the gate structure, the source/drain structure has an upper portion, a lower portion, and a neck portion between the upper portion and the lower portion, a first width of the upper portion decreases toward the neck portion, and a second width of the lower portion decreases toward the neck portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate having a base and a fin over the base;
   a gate structure wrapping around a top portion of the fin;
   a first nanostructure over the fin and passing through the gate structure;
   a source/drain structure over the fin, wherein the source/drain structure is over a side of the gate structure and connected to the first nanostructure, the source/drain structure has an upper portion, a lower portion, and a neck portion between the upper portion and the lower portion, the upper portion has a first diamond-like shape, and the lower portion is wider than the neck portion, and
   an isolation layer over the base, wherein the fin is partially embedded in the isolation layer, a bottom part of the lower portion of the source/drain structure is embedded in the isolation layer and covers a first sidewall of the fin, and a distance between the first sidewall of the fin and a second sidewall of the bottom part decreases toward the base.

2. The semiconductor device structure as claimed in claim 1, wherein the first nanostructure further passes through the source/drain structure.

3. The semiconductor device structure as claimed in claim 2, further comprising:
   a second nanostructure passing through the source/drain structure and between the first nanostructure and the fin, wherein the second nanostructure is in direct contact with the first nanostructure and the fin.

4. The semiconductor device structure as claimed in claim 1, wherein the upper portion is thicker than the lower portion.

5. The semiconductor device structure as claimed in claim 1, further comprising:
   a silicide layer covering the source/drain structure; and
   a contact structure wrapping around the silicide layer and the source/drain structure.

6. The semiconductor device structure as claimed in claim 1, wherein a width of an upper part of the lower portion continuously decreases toward the neck portion.

7. The semiconductor device structure as claimed in claim 1, wherein the upper portion of the source/drain structure is wider than the neck portion of the source/drain structure.

8. The semiconductor device structure as claimed in claim 7, wherein the upper portion of the source/drain structure is wider than the lower portion of the source/drain structure.

9. The semiconductor device structure as claimed in claim 1, wherein the lower portion of the source/drain structure has a second diamond-like shape.

10. The semiconductor device structure as claimed in claim 9, wherein the lower portion of the source/drain structure is narrower than the upper portion of the source/drain structure.

11. A semiconductor device structure, comprising:
a substrate having a base and a fin over the base;
a nanostructure over the fin;
a gate structure wrapping around the nanostructure and a top portion of the fin, wherein the gate structure comprises a gate electrode and a gate dielectric layer wrapping around the gate electrode, and the gate dielectric layer separates the gate electrode from the nanostructure and the fin;
a spacer layer over a first sidewall of the gate structure and a second sidewall of the fin, wherein the spacer layer has a sloped portion, the sloped portion is spaced apart from the fin by a distance, the distance increases toward the base, and a first bottom surface of the gate dielectric layer is lower than a second bottom surface of the spacer layer; and
a source/drain structure over the fin, wherein the source/drain structure is over a side of the gate structure and connected to the nanostructure, and the sloped portion covers a lower portion of the source/drain structure.

12. The semiconductor device structure as claimed in claim 11, wherein the source/drain structure has an upper portion, the lower portion, and a neck portion between the upper portion and the lower portion, and the neck portion is narrower than the upper portion and the lower portion.

13. The semiconductor device structure as claimed in claim 12, wherein a top surface of the sloped portion of the spacer layer is substantially level with the neck portion of the source/drain structure.

14. The semiconductor device structure as claimed in claim 11, wherein the source/drain structure wraps around the nanostructure.

15. The semiconductor device structure as claimed in claim 11, further comprising:
a dielectric layer under the spacer layer, wherein a third bottom surface of the dielectric layer is substantially level with the first bottom surface of the gate dielectric layer.

16. A semiconductor device structure, comprising:
a substrate having a base and a fin over the base;
a gate structure wrapping around a top portion of the fin;
a nanostructure over the fin and passing through the gate structure;
a source/drain structure over the fin, wherein the source/drain structure is adjacent to the gate structure, the source/drain structure has an upper portion, a lower portion, and a neck portion between the upper portion and the lower portion, a first width of the upper portion decreases toward the neck portion, and a second width of an upper part of the lower portion decreases toward the neck portion, and
an isolation layer over the base of the substrate, wherein the gate structure is over the isolation layer, a bottom part of the lower portion of the source/drain structure is embedded in the isolation layer, and the fin penetrates through the bottom part of the lower portion of the source/drain structure.

17. The semiconductor device structure as claimed in claim 16, wherein the upper portion wraps around the nanostructure.

18. The semiconductor device structure as claimed in claim 16, wherein a third width of the bottom part of the lower portion of the source/drain structure decreases toward the base of the substrate.

19. The semiconductor device structure as claimed in claim 16, further comprising:
a contact structure over the source/drain structure, wherein the contact structure wraps around the source/drain structure.

20. The semiconductor device structure as claimed in claim 16, wherein the lower portion of the source/drain structure has a diamond-like shape.

* * * * *